United States Patent [19]
Mani et al.

[11] Patent Number: 5,646,527
[45] Date of Patent: Jul. 8, 1997

[54] HALL-EFFECT DEVICE WITH CURRENT AND HALL-VOLTAGE CONNECTIONS

[75] Inventors: Ramesh G. Mani; Klaus von Klitzing, both of Stuttgart, Germany

[73] Assignees: R. G. Mani; K. von Klitzing, both of Munich, Germany

[21] Appl. No.: 513,899

[22] PCT Filed: Mar. 8, 1994

[86] PCT No.: PCT/EP94/00701

§ 371 Date: Dec. 1, 1995

§ 102(e) Date: Dec. 1, 1995

[87] PCT Pub. No.: WO94/20993

PCT Pub. Date: Sep. 15, 1994

[30] Foreign Application Priority Data

Mar. 8, 1993 [DE] Germany .................. 43 07 249.6
Mar. 16, 1993 [DE] Germany .................. 43 08 375.7

[51] Int. Cl.$^6$ .............. G01K 33/07; H01L 43/02; H03K 3/38
[52] U.S. Cl. .................. 324/251; 338/32 H; 327/511
[58] Field of Search .................. 324/207.2, 251; 338/32 H; 257/421, 425; 327/511

[56] References Cited

U.S. PATENT DOCUMENTS

| | | | |
|---|---|---|---|
| 4,125,821 | 11/1978 | Masuda | 338/32 R |
| 4,599,564 | 7/1986 | Kelleher et al. | 324/251 |
| 4,668,914 | 5/1987 | Kersten et al. | 324/251 |

FOREIGN PATENT DOCUMENTS

| | | | |
|---|---|---|---|
| 3-270181 | 12/1991 | Japan | 338/32 H |
| 508829 | 5/1976 | U.S.S.R. | 338/32 H |

*Primary Examiner*—Sandra L. O'Shea
*Assistant Examiner*—Roger C. Phillips
*Attorney, Agent, or Firm*—Helfgott & Karas, P.C.

[57] ABSTRACT

A Hall effect device has a thin Hall element (10) having at least one hole or window and is bounded accordingly by at least one inner edge (10a, 10b) and, where required, also by an outer edge. One preferred embodiment having no current-induced misalignment voltages has a first pair of current connections (A,B) at two opposed locations on the outer edge (10a); a second pair of current connections (1,2) at two opposed locations on the inner edge (10b); at least one first pair of Hall voltage connections (C,E) at two opposed locations on the outer edge (10a) between the current connections (A,B) of the first pair; and/or at least one second pair of Hall voltage connections (3,5) at two opposed locations on the inner edge (10b) between the current connections (1,2) of the second pair. The currents ($I_{A,B}$, $I_{1,2}$) applied to the current connections may be dimensioned so that no misalignment voltages caused by internal voltage drops result at the Hall voltage connections.

22 Claims, 25 Drawing Sheets

HALL-EFFECT DEVICE WITH CURRENT AND HALL-VOLTAGE CONNECTIONS

This is a National Application of PCT/EP94/00701.

FIELD OF THE INVENTION

The present invention relates to Hall-effect devices having a Hall plate or Hall element which is contacted by current connections and Hall voltage connections. Hall-effect devices of this kind of interest are also termed Hall generators or Hall probes.

DESCRIPTION OF THE RELATED ART

When a strip like electrical conductor through which a current I flows in its longitudinal direction and which is thin as compared to its width ("Hall element") is brought into a magnetic field having a component perpendicular to the plane of the conductor exhibiting the magnetic field strength B*, then due to the so-called Hall-effect between the side edges of the strip-like conductor a voltage, the so-called Hall voltage $$U_H = A_H \cdot I \cdot B^* / d \tag{1}$$

materializes, in which $A_H$ is the Hall coefficient $$A_H = r/(n \cdot e) \tag{2}$$

where:

B*=magnetic field strength,
d=thickness of the conductor,
r=factor depending on the mobility of the charge carriers,
n=density of the charge carriers,
e=elementary charge.

The Hall effect is made use of in science and technology for the most varied of purposes, e.g. for rugged magnetometers, magnetic-field actuated switches, position sensors and, more recently, also for highly precise resistance standards in which the quantum Hall-effect is made use of, see e.g. the publications of Kordic in "Sensors and Actuators", 10 (1986) pages 347–378 and of Popovic in "Sensors and Actuators" 17, (1989) pages 39–53.

In it simplest form a Hall-effect device (Hall generator) comprises where possible a thin, rectangular or strip-like electrical conductor ("Hall plate" or "Hall element") provided with four electrical connections and is usually fabricated of a semiconductor material such as e.g. Si, Ge, GaAs, Bi etc.

From the equation (1) one could assume that the sensitivity of a Hall device, i.e. the ratio of Hall voltage to magnetic field strength is able to be boosted to any extent by increasing the current I. In actual practice, however, it is evident that due to disturbing effects, particularly deficient alignment of the connections (positioning errors) and lack of homogenity of the conductor material a limit is very quickly reached, since these imperfections cause a resistance-induced voltage drop and thus a misalignment voltage (offset voltage) at the Hall voltage connections even in the absence of a magnetic field. When the Hall voltage attains the order of these misalignment voltages in the presence of a weak magnetic field, proper measurement is apparently no longer assured.

Various means of eliminating or compensating these misalignment voltages are already known. The simplest method involves measuring the signal at the Hall voltage connections for two opposing directions of the magnetic field, the misalignment voltage then being able to be eliminated by subtraction of the signals obtained. In actual practice, however, reversing the direction of the magnetic field is usually very difficult to carry out. Another, somewhat more complicated procedure works by swapping the current connections and the Hall voltage connections without a field reversal. For this purpose relatively complicated changeover switches are required, in addition to forming the signal difference. In conclusion it is known to compensate the misalignment voltages by employing paired Hall-effect devices connected to counteract each other. However, due to the inhomogenities in the material which are practically unavoidable it is hardly possible to fabricate Hall elements which are precisely identical, even when they are formed on the same substrate. Apart from this, such arrangements require twice the surface area and power.

For some applications such as e.g. measuring locally variable magnetic fields such as gradient fields better, especially simpler, more accurate and better-functioning Hall-effect devices are needed.

On the basis of this prior art the present invention is mainly based on the object of formulating Hall-effect devices of novel configurations with which the above-mentioned resistance-induced misalignment voltages are avoided by simple means and other measurement tasks are permitted.

SUMMARY OF THE INVENTION

A further object of the present invention is to formulate novel Hall-effect devices exhibiting new features or permitting new applications or better achieving known objects than hitherto known Hall-effect devices.

The present invention is based on the discovery that Hall-effect devices may also be achieved even with a single Hall element having at least one hole or window bounded in each case by an inner edge.

Expressed mathematically the Hall element thus has the form of a multiply-connected domain which in the simplest case is the form of doubly-connected domain, i.e. that closed curves exist in the domain which can only be drawn together into a point by a single or multiple violation of an edge.

A further aspect of the present invention is that the boundary conditions may be changed by injecting more than one current in the Hall element.

One preferred doubly connected configuration is that of a rectangular frame which is bounded by an outer and an inner edge. Here, currents can be injected into the frame-shaped Hall element at two each opposed locations on the outer and inner edge and Hall voltages can be obtained at two opposed locations on the outer and/or inner edge. The injected currents may be adjusted interdependently so that the resulting current disappears in the vicinity of the Hall connections. Accordingly, no voltage drop can occur in the region of the Hall voltage connections and thus also no resistance-induced misalignment (offset) voltage.

By means of a Hall element having several holes or windows distributed in series or arbitrarily over a surface area localized magnetic field distributions may be measured. At the inner edge of each window a current may be injected and a Hall voltage obtained and offsetting the misalignment voltage may be achieved by means of a common current injected at the outer edge.

The present Hall-effect devices are thus characterized by being suitable for many and varied applications. The dissipation loss and thus the thermal noise are low; the sensitivity is at least two orders higher than that of comparable Hall-effect devices and due to the elimination of resistance-induced misalignment voltages the temperature dependency of the Hall voltage signal is also small.

BRIEF DESCRIPTION OF THE DRAWINGS

The invention will now be explained in more detail with reference to the drawings with a discussion of still further advantages and features of the invention, in which.

DESCRIPTION OF THE PREFERRED EMBODIMENTS

All Hall-effect devices according to the invention contain a Hall plate or a Hall element, at least one pair of current connections and at least one pair of Hall voltage connections. In some of the embodiments, however, a current connection may also be used to obtain a Hall voltage, the current and Hall voltage connections then being one and the same. The Hall-voltage element is in general a surface area body, the thickness of which in comparison to its width is to be relatively small, i.e. it may have the shape of a thin layer. It may also form part of an integrated circuit—see the publication of Kordic as mentioned above. For the Hall element, materials having a low carrier density are preferred, i.e. in particular semiconductor materials such as silicon, germanium, $A_N B_Y$ compounds such as GaAs, bismuth etc. as known to the person skilled in the art.

The Hall element may be structured in the usual way. A practically two-dimensional conducting "electron gas" layer (thickness approx. 10 nm) is furnished by certain epitaxial heterostructures, e.g. GaAs on AlGaAs. The charge carrier density in this case amounts to approx. $10^{11} cm^{-2}$. The Hall element may also consist of a thin (e.g. 2 mm thick) doped layer of silicon (carrier density roughly $10^{18} cm^{-3}$).

For all Hall-effect devices described in the following a magnetic field acts on the Hall element in operation which is oriented perpendicular to the plane of the Hall element or has at least one component standing vertically on the planet of the Hall element.

Figure 1A:
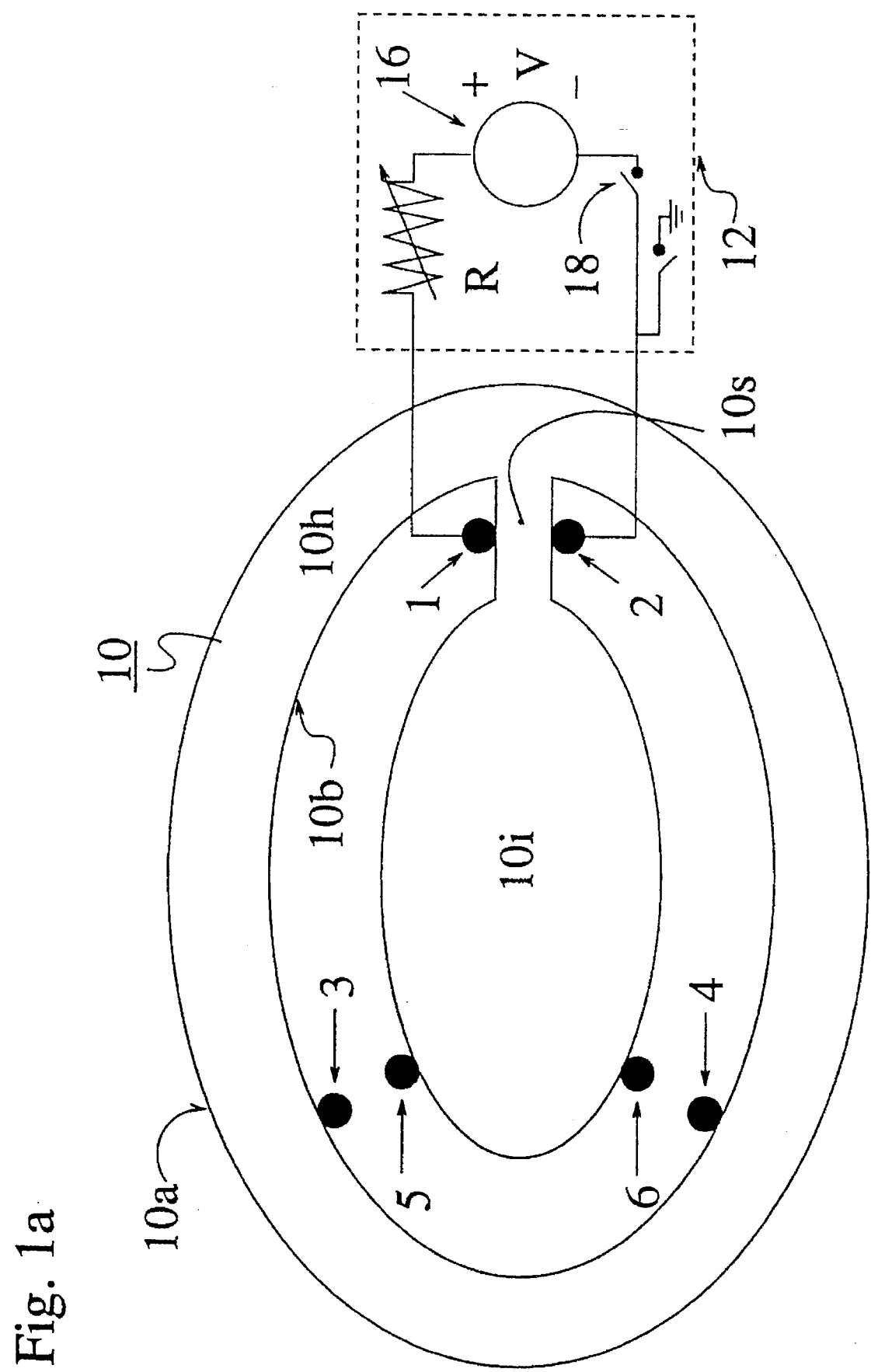
FIG. 1a is a schematic representation of a Hall-effect device according to a first embodiment of the invention.

The Hall-effect device shown schematically in FIG. 1a contains a Hall element 10, i.e. a thin, practically two-dimensional conductor having a curved, particularly C-shaped hole bounded by an inner edge 10b. In this example embodiment the existence of an outer boundary, i.e. on outer edge 10a is not important. The "ends" of the C-shaped hole bound a web 10s connecting the main or outer part 10h to an elongated, in this case elliptically shaped inner part 10i of the Hall element. At the web 10s the inner edge 10b is contacted by two current connections 1, 2 which are coupled to a current source 12. In the embodiment shown the current source contains a voltage source 16, an adjustable resistance R in series therewith and a switching means 18.

At the inner edge 10b spaced away from the current connections 1,2 at least one pair of Hall voltage connections 3, 5 and/or 4,6 is provided at which a Hall voltage can be obtained. The Hall voltage connections of each pair are arranged so that a current path connecting them is intersected by a line connecting the current connections 1, 2 in the Hall element.

By means of the device as shown in FIG. 1a the normal Hall effect may be measured with an apparent reversal of sign without knowledge of the current distribution. One important feature of the device as shown in FIG. 1a and of many other devices according to the invention yet to be described in the following is that the excitation current (bias current) disappears in the vicinity of the Hall voltage contacts since it flows practically exclusively along the line connecting the current connections 1, 2 across the web 10s.

Figure 1B:
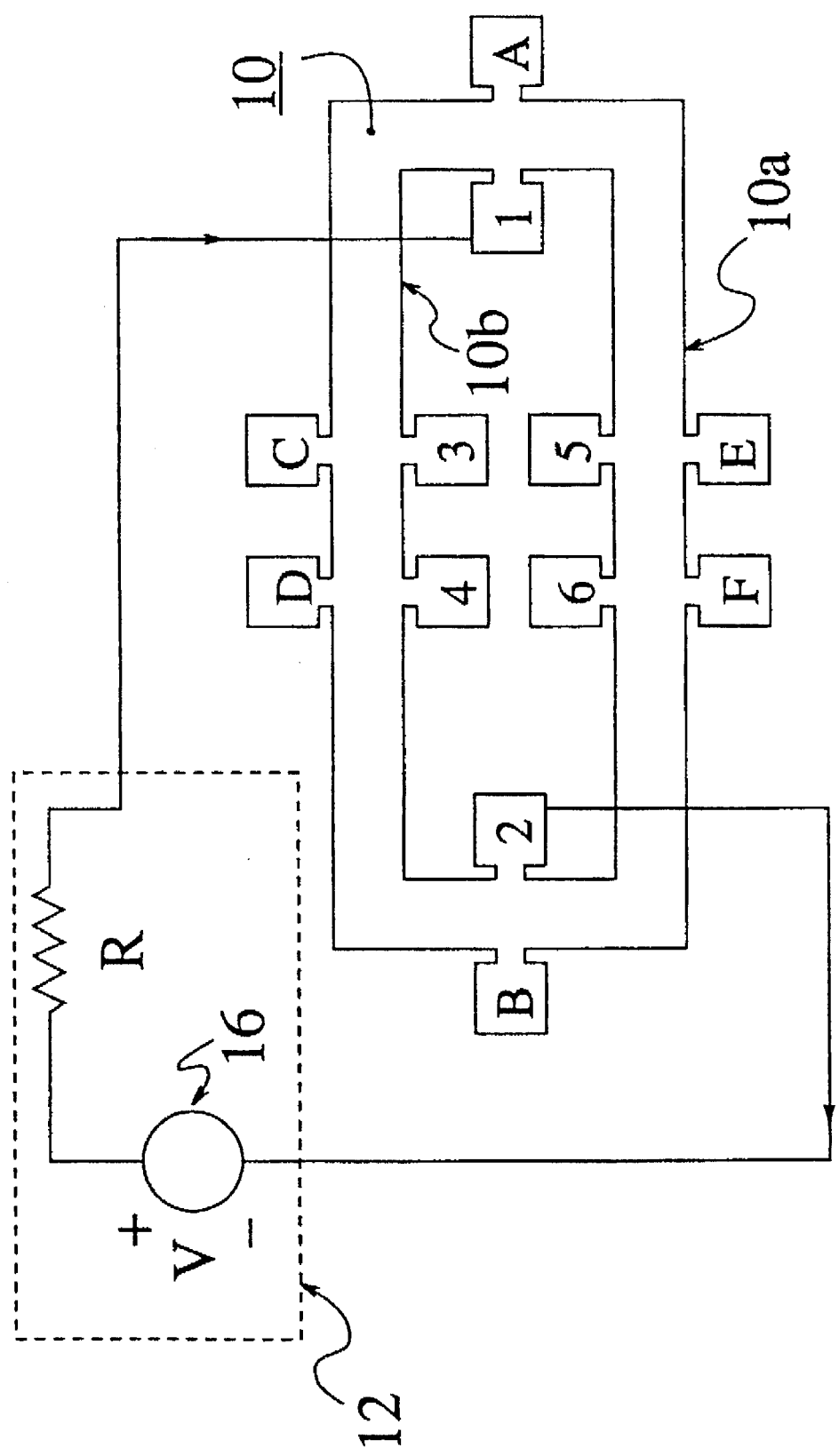
FIG. 1b is a schematic representation of a second embodiment of the invention.

In the Hall effect device according to the invention as shown in FIG. 1b the Hall element 10 has the form of an elongated rectangular frame ("anti-Hall plate") which is bounded by an outer edge 10a and an inner edge 10b and has strip-like sides or legs (two short, two long) of equal width. At two opposed sides of the inner edge 10b two current connections 1 and 2 are arranged which are coupled to a current source 12 containing a voltage source 16 and a resistance R in series therewith. At the inner edge 10b at least one pair of Hall voltage connections (in the example embodiment shown two pairs of Hall voltage connections 3-5 and 4-6) is/are arranged at which a Hall voltage may be obtained according to a magnetic field acting on the Hall element.

The width of the striplike sides of the frame-shaped Hall element 10 amounted to 300 mm in one practical embodiment, this value, of course, not to be understood as being restrictive.

In this and all of the following example embodiments instead of the configuration shown any other configuration topologically equivalent as regards the Hall element may be employed. For the current source too, any device may be used, capable of furnishing a suitable direct current, alternating current or switched current, regulated or non-regulated, of constant or variable strength.

Figure 2:
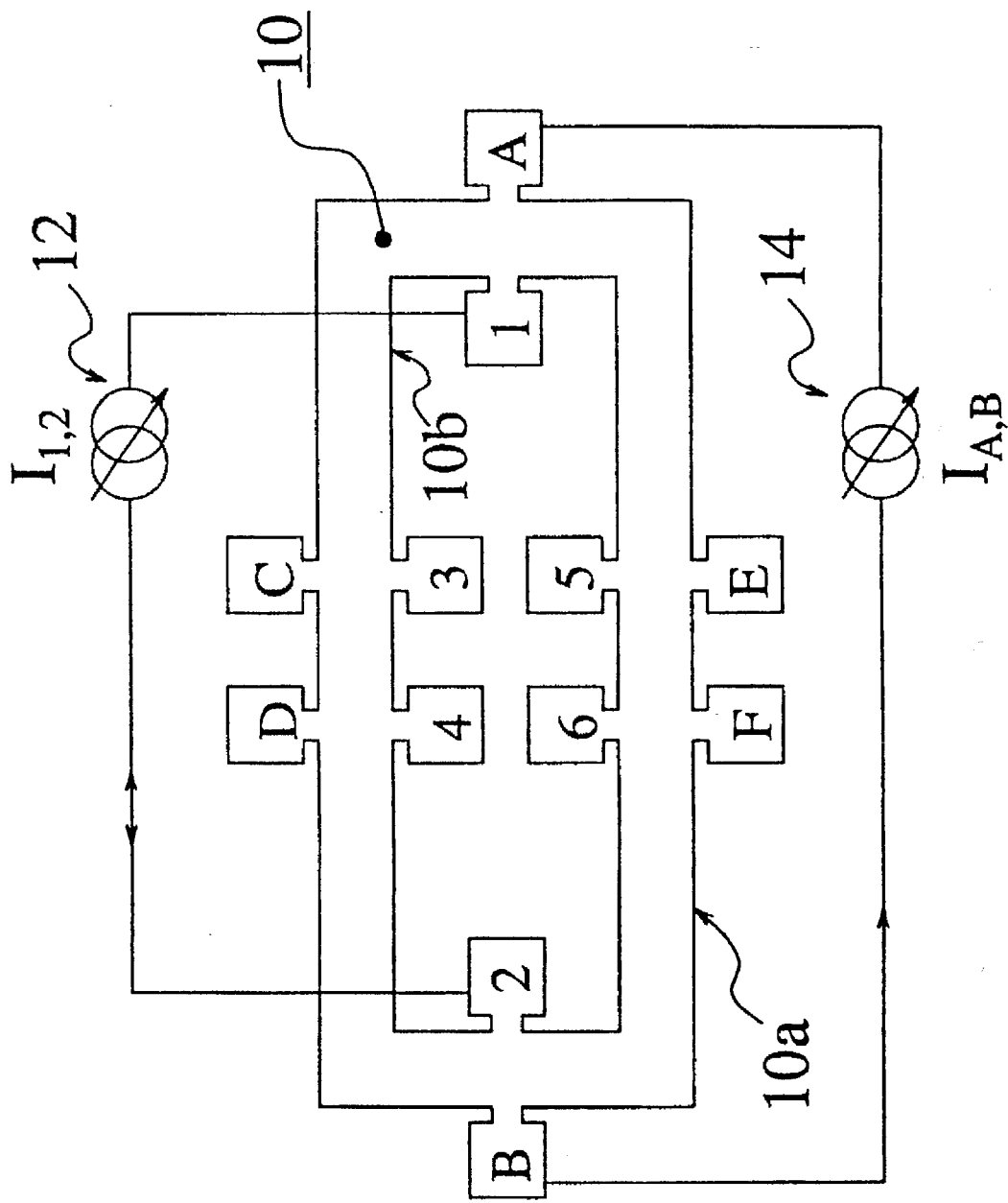
FIGS. 2 and 3 are a schematic representation of Hall-effect device compensated for misalignment voltage according to a third embodiment of the invention having a current supply circuit containing two separate current sources.

In the Hall-effect device compensated for misalignment voltage as shown in FIG. 2 current connections A and B are provided in addition to the components mentioned in conjunction with FIG. 1b, also on the outer edge 10a and which are coupled to a second current source 14. In addition, at least one pair of Hall voltage connections C-E and/or D-F and/or 3-5 and/or 4-6 is provided at the outer edge 10a and/or at the inner edge 10b. The spacings of a current connection away from the Hall voltage connections of a pair are equal and large as compared to the spacing of neighboring current connections A 1 and B-2 respectively, these not representing necessary features, however. The current $I_{1,2}$ and $I_{A,B}$ respectively of at least one of the two current sources 12,14 is adjustable.

As regards the injected current the Hall voltage between the Hall voltage connections C-E and D-F respectively is dictated exclusively by the current $I_{A,B}$. The Hall voltage between the Hall voltage connections 3 5 and 4 6 is dictated exclusively by the current as regards the injected current $I_{1,2}$. These two currents may be superimposed so that there is practically no current in the regions of the long legs of the Hall element at the edges of which the Hall voltage connections 3-6 and C-F respectively are applied, thus enabling any current-induced misalignment voltages between the associated Hall voltage connections to be eliminated. The current flows practically only across the short legs, i.e. in this example embodiment between the connections A and 1 from the outer edge to the inner edge whilst flowing between the connections 2 and B from the inner edge to the outer edge.

Figure 3:
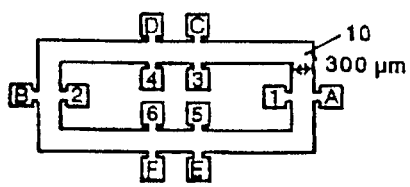
Figure 3A:
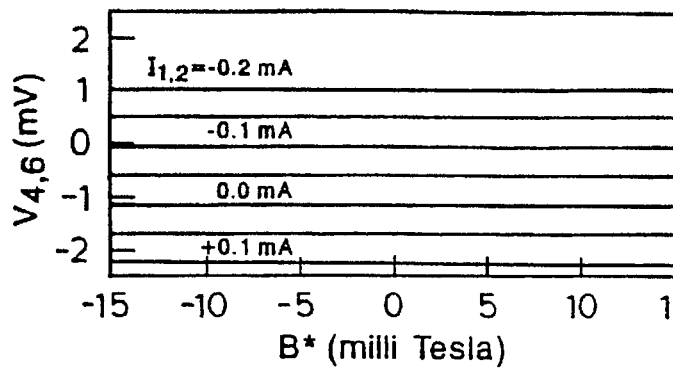
FIGS. 3a thru 3f are graphs explaining the functioning of the device according to FIG. 2 and FIGS. 4 thru 24 are schematic representations of further example embodiments of Hall-effect devices according to the invention.
Figure 3B:
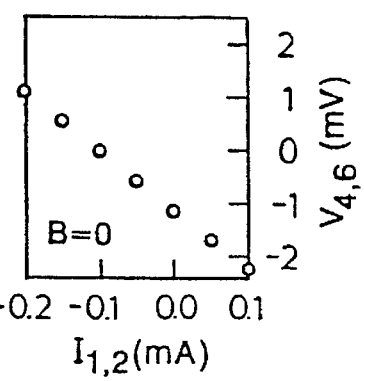
Figure 3C:
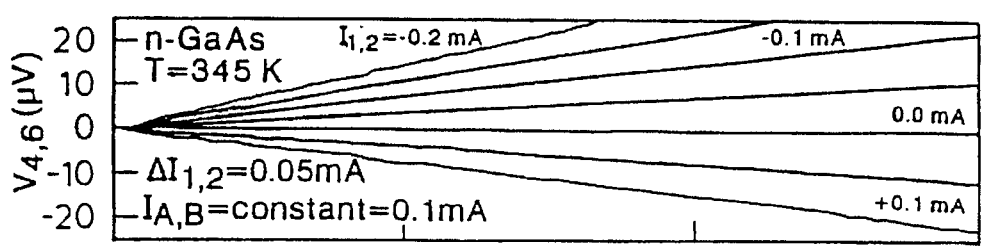
Figure 3D:
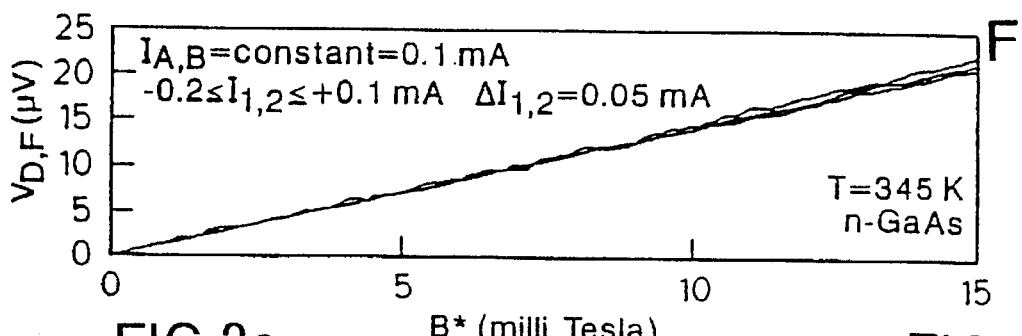
Figure 3E:
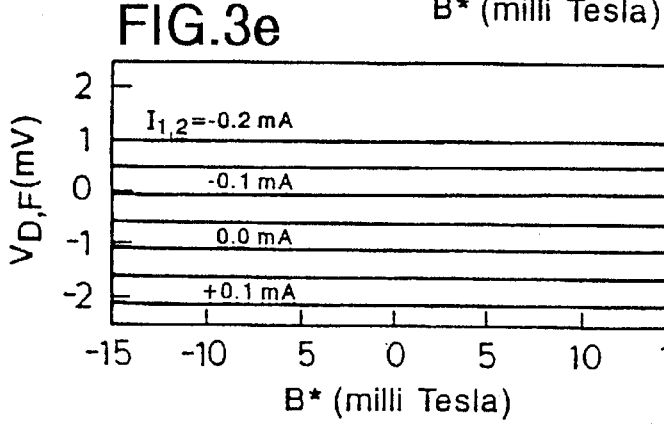
Figure 3F:
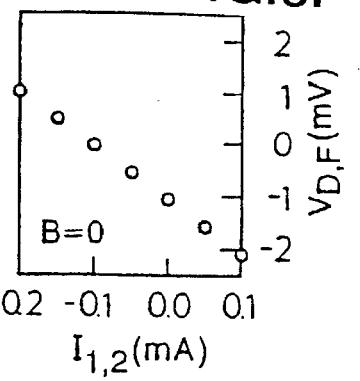

The effect of this superposition is illustrated in the graphs a) thru f) of FIG. 3. The measurements were made with a Hall element having the configuration as shown in FIG. 2, comprising a GaAs epitaxial layer ($n_{295K}=22 \cdot 10^{17}$cm$^{-3}$). The current $I_{A,B}$ was maintained constant at 0.1 mA.

Graph a) shows the Hall voltage signal $V_{4,6}$ between the inner edge connections 4 and 6 in mV as a function of the magnetic field strength B* in millitesla, parameter $I_{1,2}$ in increments of 0.05 mA. The slight slope which changes with $I_{1,2}$ is to be noted.

Graph b) shows $V_{4,6}$ as a function of $I_{1,2}$ for B*=0. This signal represents the misalignment voltage caused by the drop in resistance-voltage in the Hall element. It is to be noted that the misalignment voltage practically disappears when $I_{1,2}=-I_{A,B}=0.1$ mA.

Graph 3c shows the Hall voltage signal compensated for misalignment voltages $$dV_{4,6}=(V_{4,6[+B]}-V_{4,6[-B]})/2 \qquad (3)$$

between the inner edge Hall voltage connections 4 and 6 as a function of B*, parameter $I_{1,2}$ in increments of 0.05 mA. It is to be noted that that $dV_{4,6}$ disappears when $I_{1,2}=0$ and that it is proportionally dependent only on $I_{1,2}$, $dV_{4,6}$ also being a function of $I_{A,B}$.

Graph 3d) shows the Hall voltage signal compensated for misalignment voltages $$dV_{D,F}=(V_{D,F[+B]}-V_{D,F[-B]})/2 \qquad (4)$$

between the outer edge Hall voltage connections D and F. It is to be noted that there is no change of $dV_{D,F}$ for changes of $I_{1,2}$.

Graph e) shows $V_{D,F}$ as a function of B*, parameter $I_{1,2}$ in increments of 0.05 mA. The slightly positive increase depends on changes in the current $I_{1,2}$.

Graph f) shows $V_{D,F}$ as a function of $I_{1,2}$ for B*=0, i.e. the misalignment voltage caused by internal voltage drops at the outer edge of the Hall element 10. This misalignment voltage practically disappears of $I_{1,2}=-I_{A,B}=0.1$ mA as in graph b).

Figure 4:
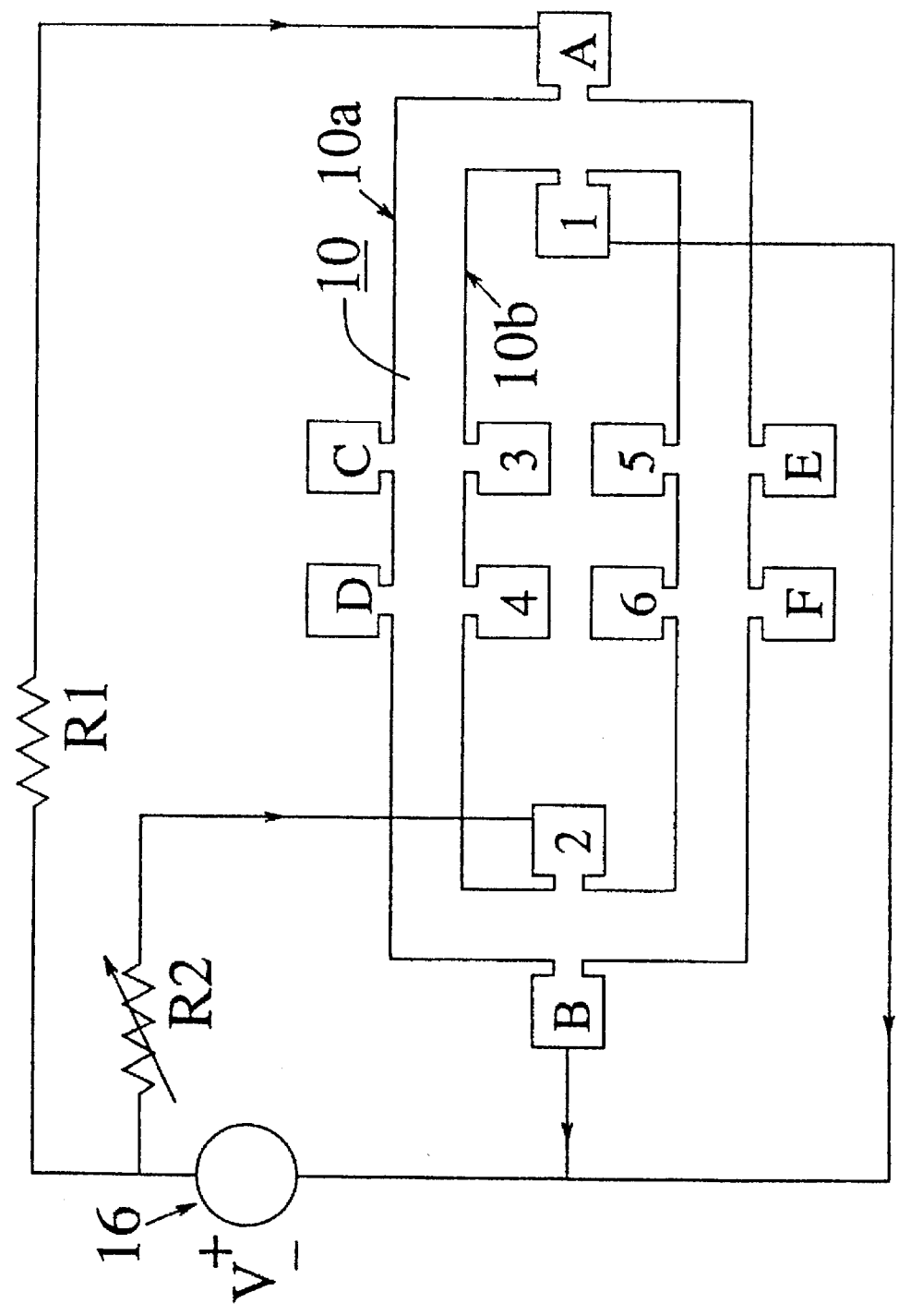
Figure 5:
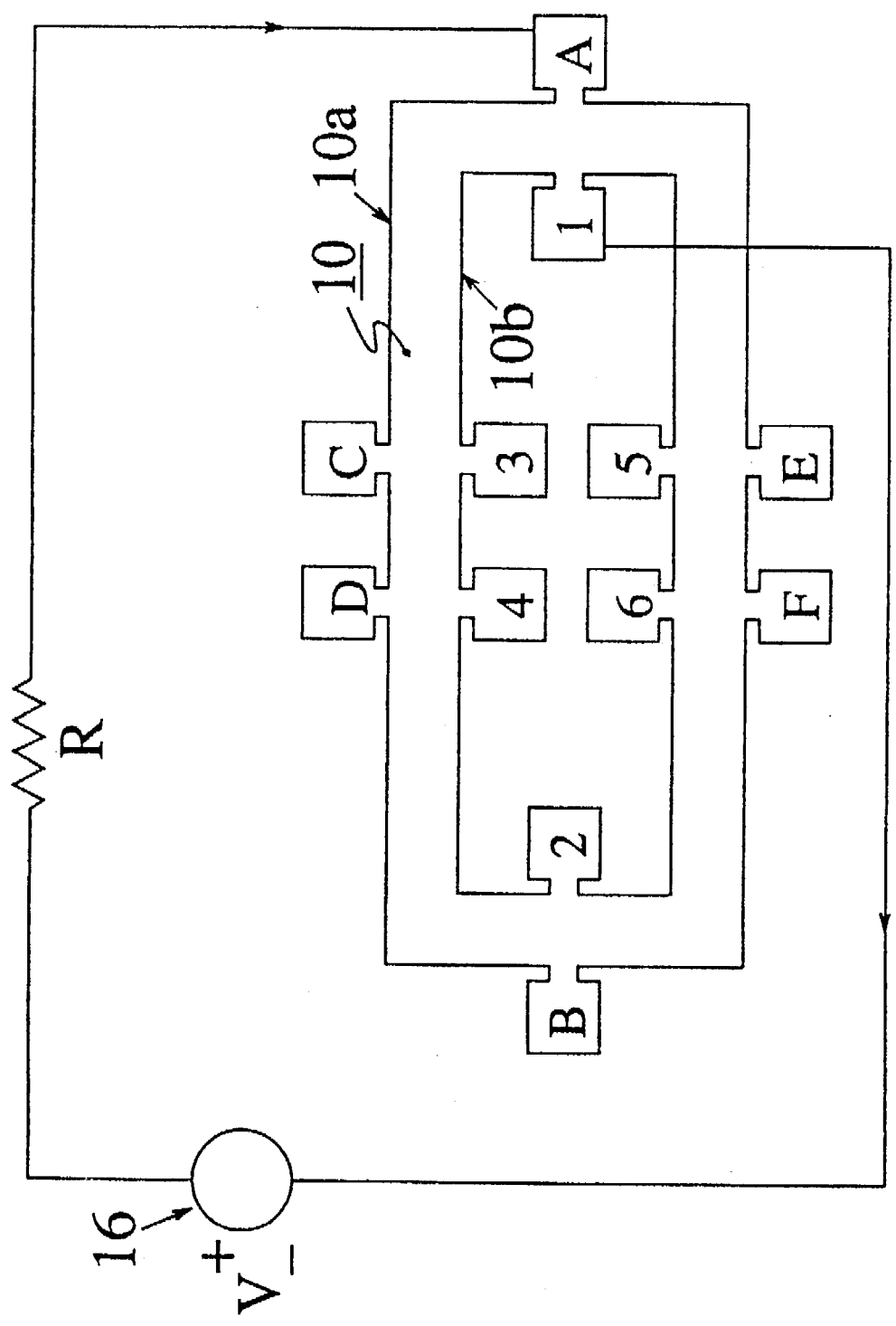

As shown in FIG. 2 the Hall element 10 was fed with currents $I_{A,B}$ and $I_{1,2}$ respectively from two separate current sources 12, 14 via the current connections A,B and 1,2 respectively. FIGS. 4 and 5 show example embodiments of Hall effect devices compensated for misalignment voltages according to the invention which contain only one single source of energy for the power supply.

The Hall-effect device as shown in FIG. 4 contains a power supply comprising a voltage source 16 and two resistors R1 and R2 of which the one, in this case R2, is variable. The one terminal of the voltage source 16 is connected to the current connections B and 1, whilst the other terminal is coupled via the resistor R1 to the current connection A and via the resistor R2 to the current connection 2.

For its power supply the Hall-effect device shown in FIG. 5 contains a voltage source 16 and a resistor R in series with the current connections 1 and A. Here, a Hall voltage signal may be obtained at the Hall voltage connections 3-5 and/or 4-6 and/or the Hall voltage connections C-E and/or D-F connecting the outer edge. A Hall voltage signal may also be obtained between two Hall voltage connections located on differing edges, i.e. at each of the connection pairs C 3, D 4, E 5 and F-6.

Figure 6:
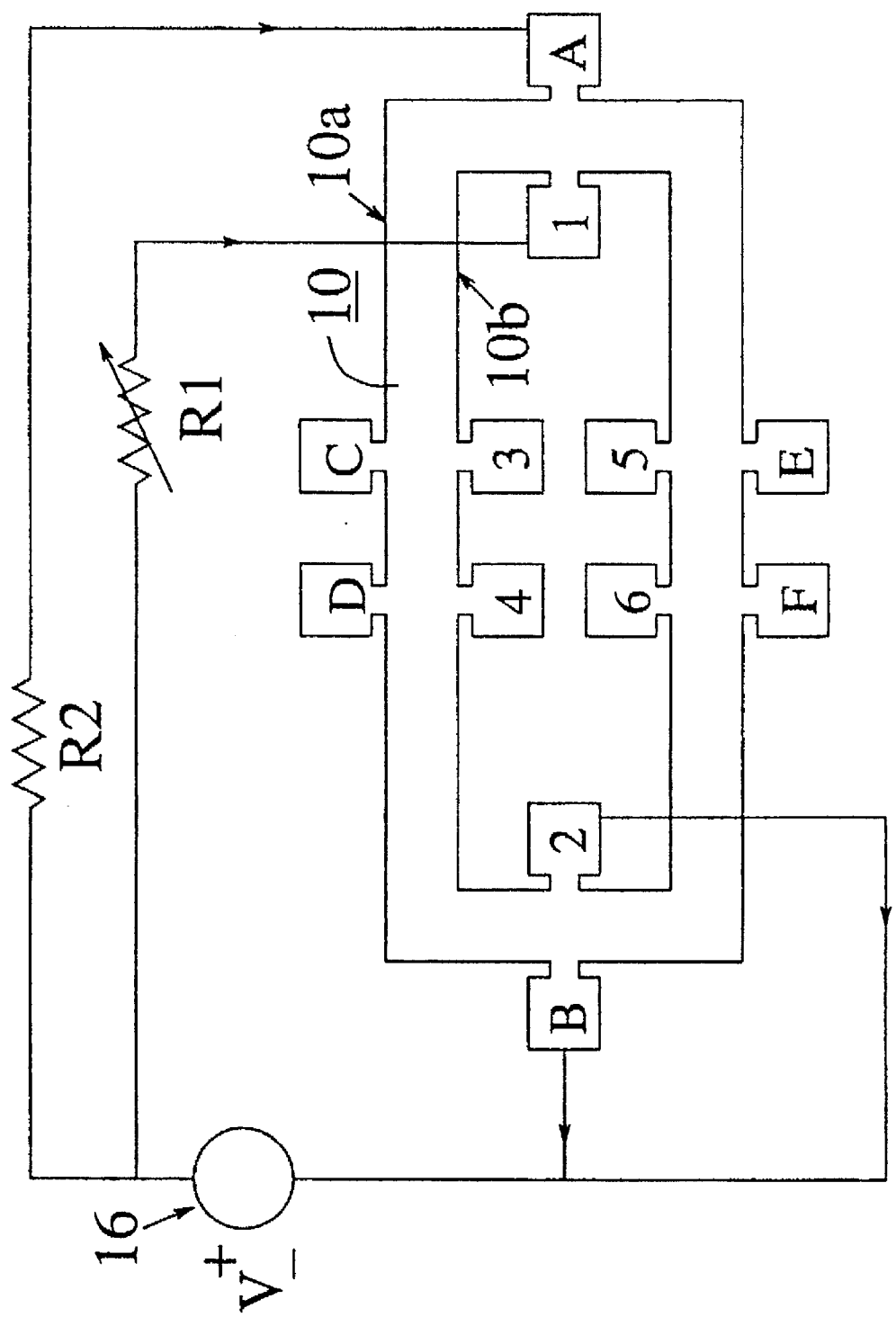

In the embodiment as shown in FIG. 6 the power supply contains a voltage source 16 and two resistors R1, R2. The one, here the negative terminal of the voltage source 16 is connected to the current connections B and 2. The other, the positive terminal of voltage source 16 is connected via resistor R1 to the current connection 1 and via resistor R2 to the current connection A. Otherwise the Hall-effect devices according to FIGS. 4 thru 6 correspond to those as shown in FIGS. 1 and 2, thus making any further explanation superfluous.

Figure 7:
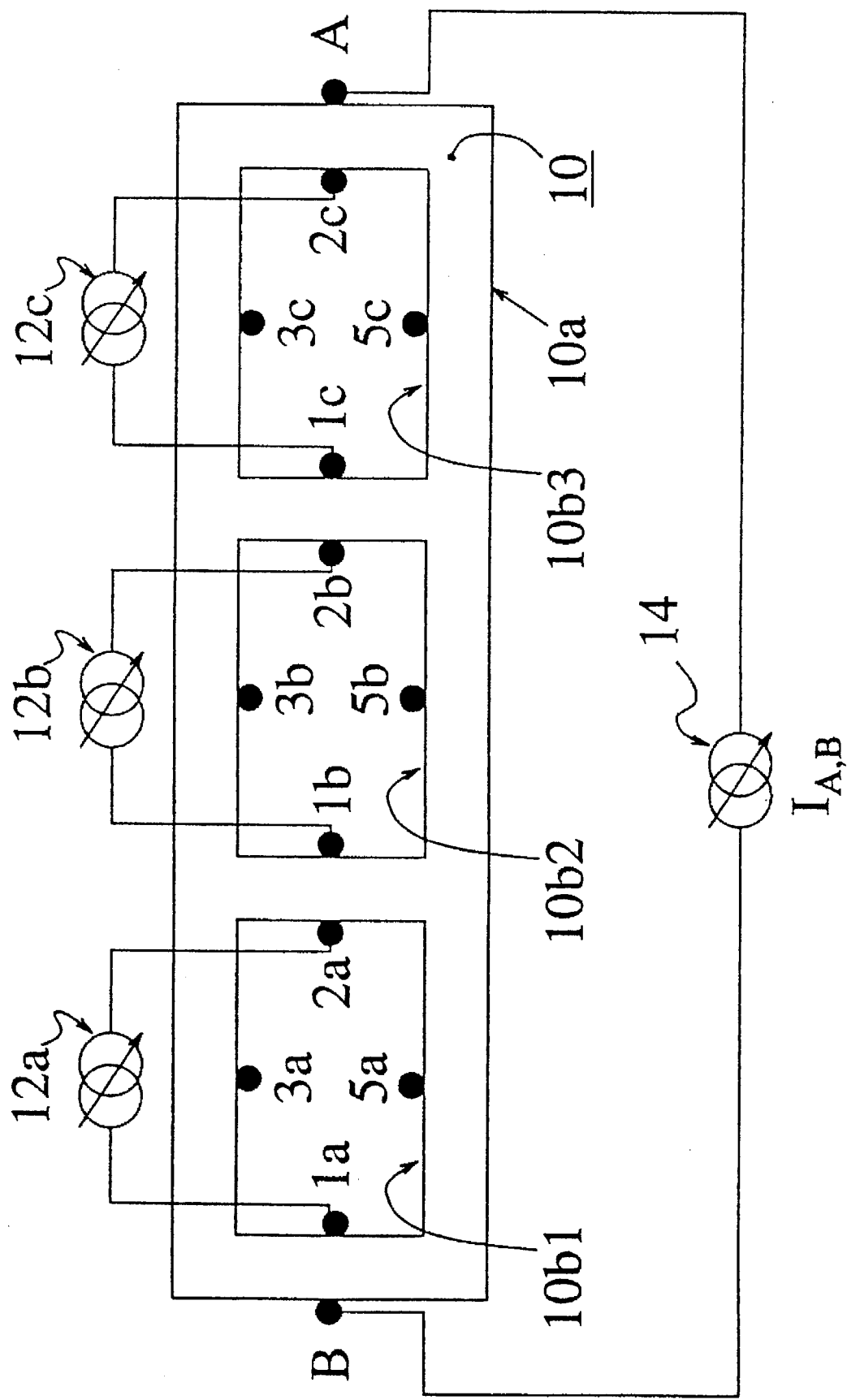

The Hall-effect device as shown in FIG. 7 has an elongated Hall element having several, in this case three, holes or windows arranged in series, it thus having an outer edge 10a as well as three inner edges 10b1, 10b2, 10b3. At two opposed locations of the outer edge two current connections A nd B are provided which are connected to a current source 14. The inner edges are each coupled to a pair of current connections 1a, 2a and 1b, 2b and 1c,2c respectively which are coupled respectively to the corresponding adjustable current sources 12a, 12b and 12c, and contacted at least to one pair of Hall voltage connections 3a, 5a, or 3b,5b or 3c, 5c. Functioning is as regards each window analogous to that according to FIG. 2. By means of this device a magnetic field gradient running along the series of windows may be measured.

FIG. 7 may be modified in accordance with FIGS. 4 thru 6 and only two or more than three windows may be provided and the windows may be distributed in any arrangement in the Hall element.

Figure 8:
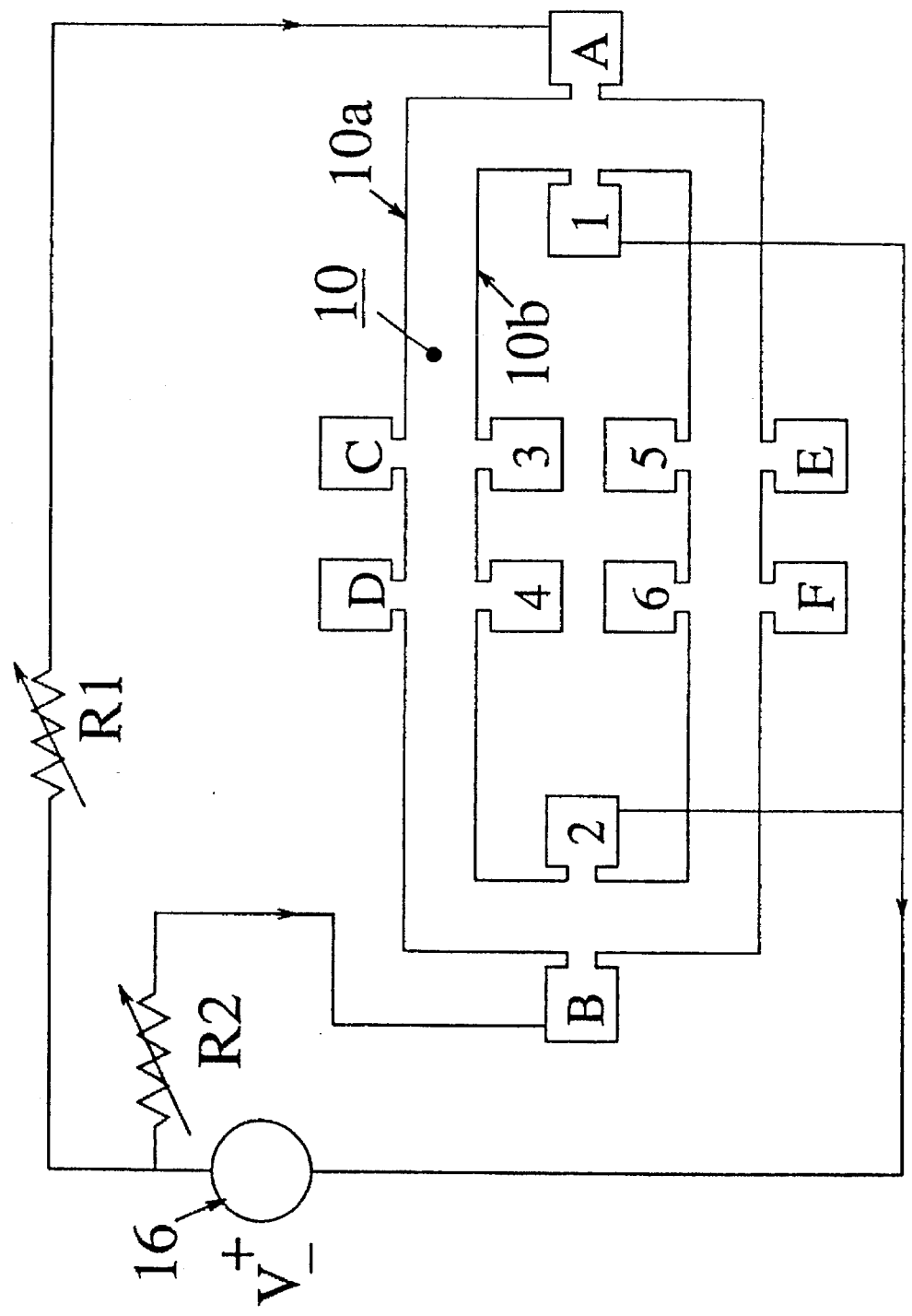

The embodiment as illustrated in FIG. 8 is similar to that as shown in FIG. 4, except that the one terminal of the voltage source 16 is coupled to the current connection B via the resistor R2, whilst the current connection 2 is connected to the other terminal of the voltage source 16. In this case, however, both of the currents flow from the current connections A,B at the outer edge 10a to the corresponding current connection 1 and 2 respectively at the inner edge. This device operates as a magnetic field gradient detector. When the magnetic field is homogenous no Hall voltage occurs.

Figure 9:
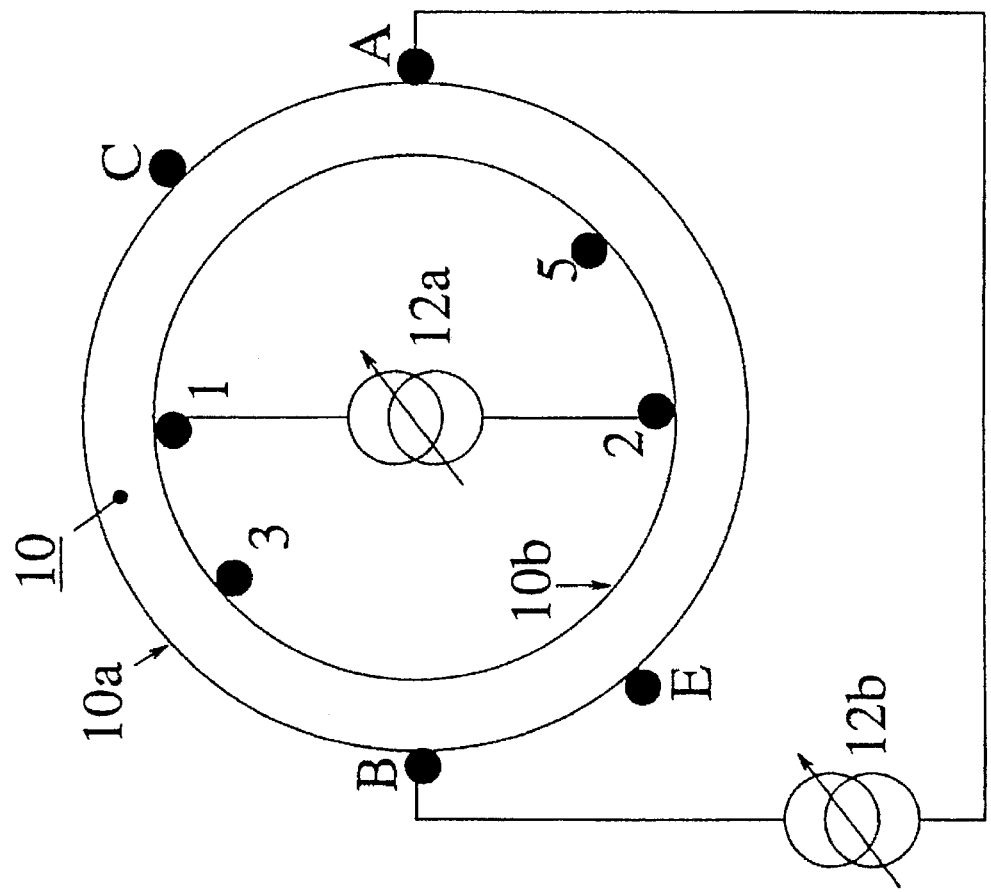

The embodiment illustrated in FIG. 9 has a ring-shaped Hall element 10 which is provided at the inner edge with two current connections 1,2 diametrally opposed which are coupled to a current source 12a. At diametrally opposed locations of the outer edge which as regards the current connections 1, 2 are displaced 90°, two further current connections A,B are provided which are coupled to a second current connection 12b. At diametrally opposed locations on the outer edge which are displaced by 45° as regards the current connections two Hall voltage connections C,E are provided. A further pair 3,5 of Hall voltage connections is provided at the inner edge 10b. The Hall voltage connections 3,5 are displaced azimuthally as regards the current connections 1,2.

The device as shown in FIG. 9 may be operated as follows: by means of the current source 12a a constant current is injected in the Hall element. The offset voltage between the Hall voltage connections 3,5 is measured. The current from the current source 12a is then turned OFF. A current is then injected by means of the current source 12b via the connections A,B into the Hall element and the current is altered until the voltage between the connections 3,5 has the same amount, but of opposite sign, to that of the offset voltage measured previously. The current source 12a is then returned ON so that it furnishes the same current as for the first ON. The offset voltages having the same amount, but oppositely poled, then cancel each other out between the connections 3,5 so that the voltage between the connections 3,5 depends exclusively on the magnitude of a magnetic field acting on the Hall element.

Figure 10C:
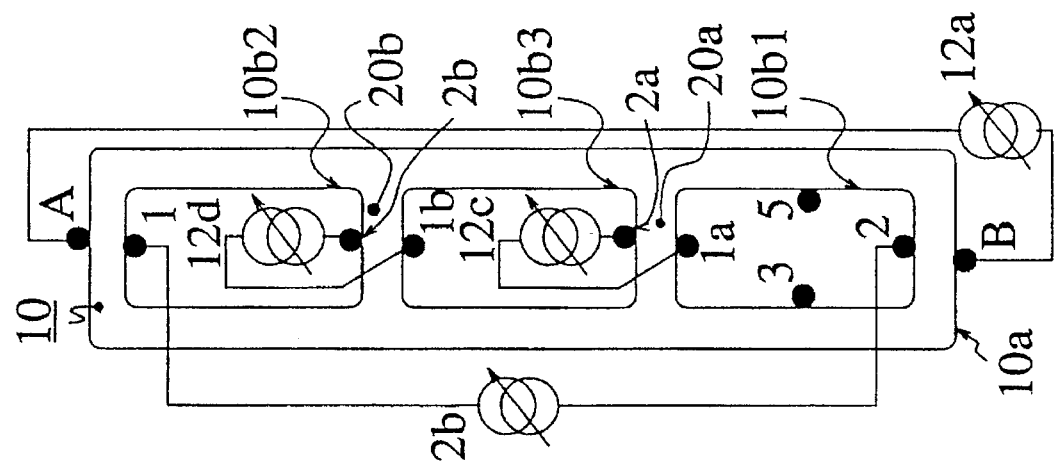
Figure 10B:
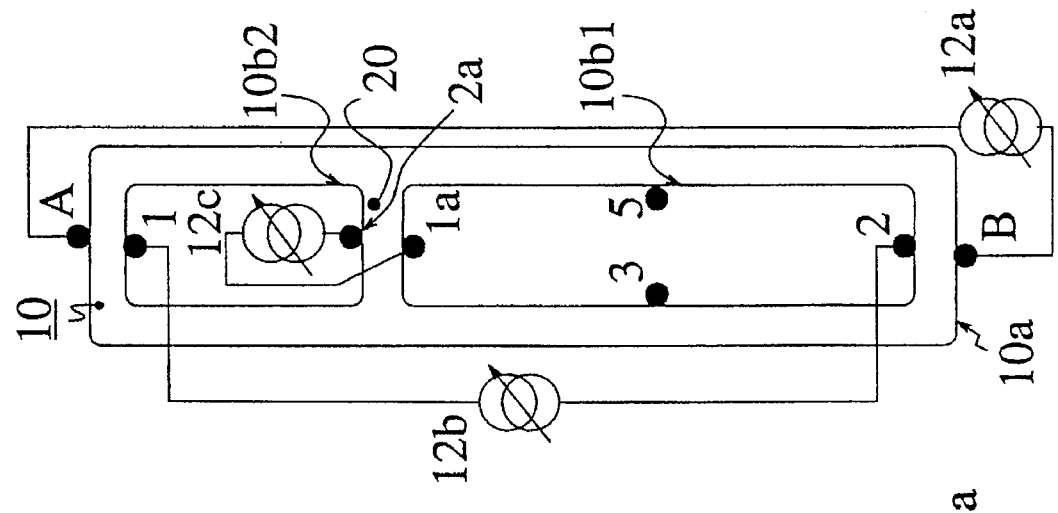
Figure 10A:
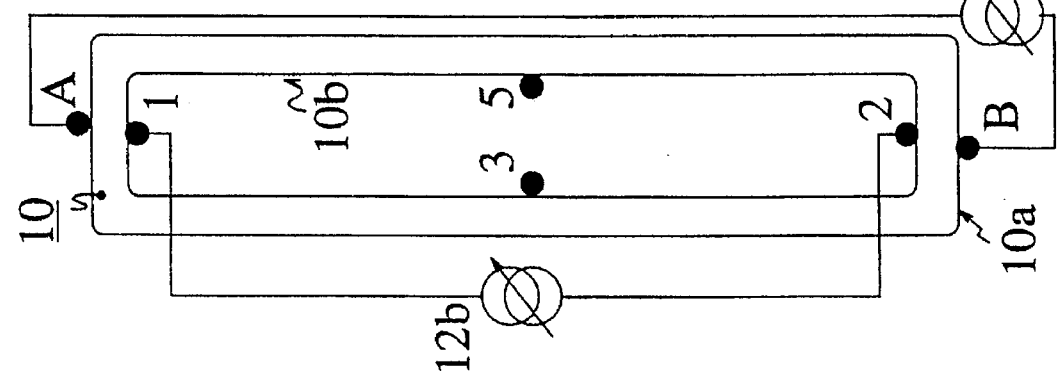

FIG. 10a illustrates a Hall-effect device of the type as already explained on the basis of FIG. 2. It is illustrated in FIGS. 10b and 10c how one such Hall-effect device may be modified.

The Hall effect device as shown in FIG. 10b contains two holes which are separated by an integral web 20 of the Hall element. The first hole is bounded by an inner edge 10b1, the second hole by an inner edge 10b2. The web 20 thus divides the sole hole of the device as shown in FIG. 10a between the current connection 1 and the Hall voltage connections 3,5 into two holes. A third voltage source 12c is connected between two current connections 1a, 2a located on opposite sides of the web 20 on the inner edge 10b1 of the one hole and on the inner edge 10b2 of the other hole respectively.

FIG. 10c shows a Hall effect device which is divided into two webs 20a, 20b. Web 20a corresponds to web 20 as shown in FIG. 10b. Web 20b, like web 20a, is provided with two current connections 1b, 2b which are coupled to a fourth current source 12d.

It will be appreciated that this divisioning by additional webs and current sources may be continued to any extent. The current of all or of a few current sources may be variable as indicated by a tilted arrow. Additional Hall voltage contacts may be provided as illustrated e.g. by reference to FIGS. 2 and 7. The holes and the outer edge of the devices as shown in FIGS. 10b and 10c need not necessarily be rectangular and the holes may be arranged in any orientation with respect to each other.

Figure 11:
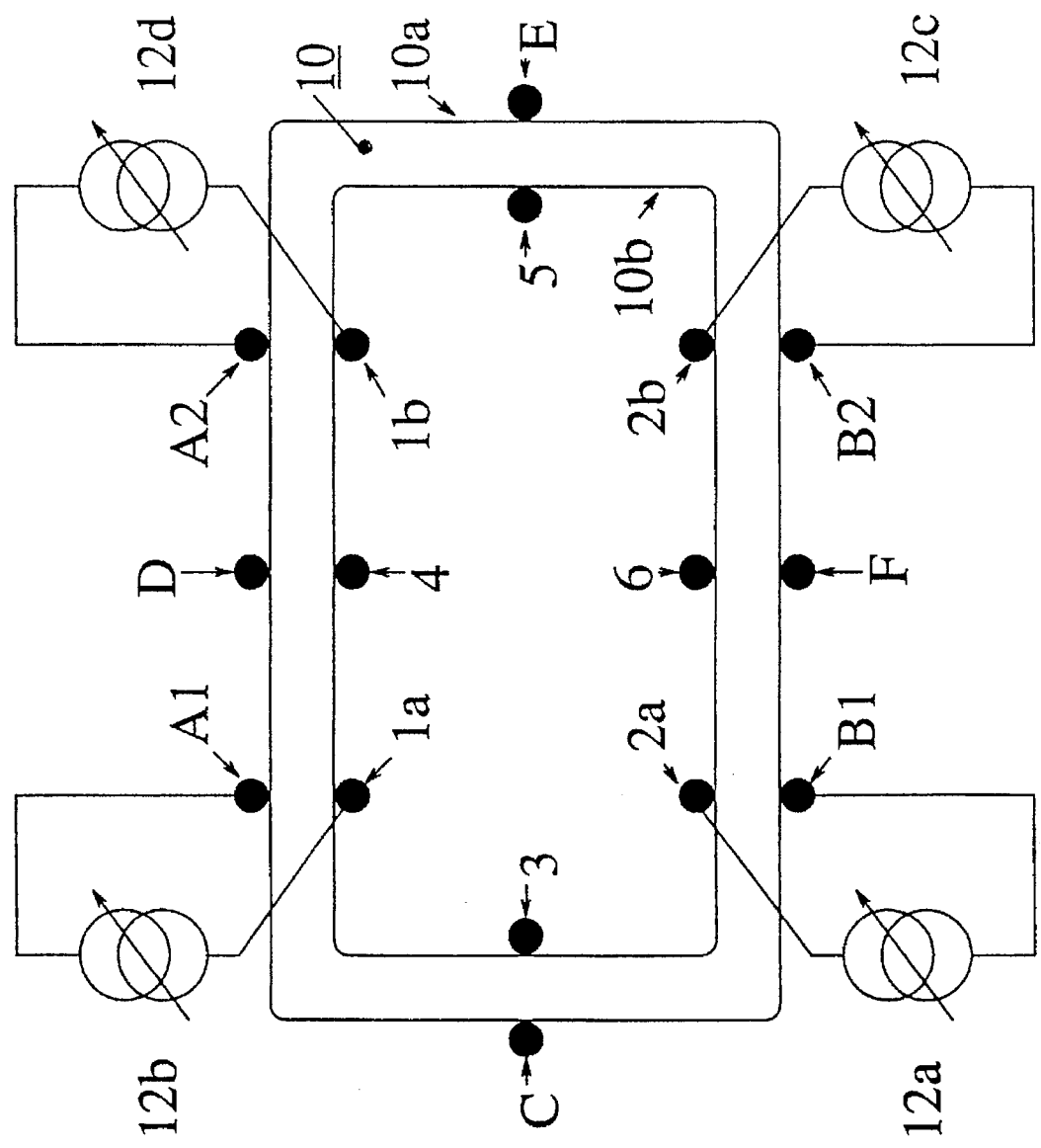

The Hall-effect device illustrated in FIG. 11 contains a frame shaped Hall element 10 having an outer edge 10a and an inner edge 10b. Between the outer edge 10a and the inner edge 10b four current sources 12a, 12b, 12c, 12d are connected. Current source 12a is coupled to connections B1 and 2a, current source 12b to connections A1 and 1a, current source 12c to connections B2 and 2b, and the current source 12d to connections A2 and 1b. The connection pairs A1, 1a and A2, 1b are located on a long leg of the rectangular Hall element 10, equispaced from the center of this leg, where Hall voltage connections D and 4 are provided. The same correspondingly applies to the current connection pairs B1, 2a and B2,2b as regards the Hall voltage connections F and 6 arranged at the center of the other long leg. At the center of the short leg Hall voltage connections 3 and 5 are provided at the inner edge and Hall voltage connections C and E at the outer edge. In this device the Hall effect is differentially generated and integrated in situ within a single Hall element.

Figure 12:
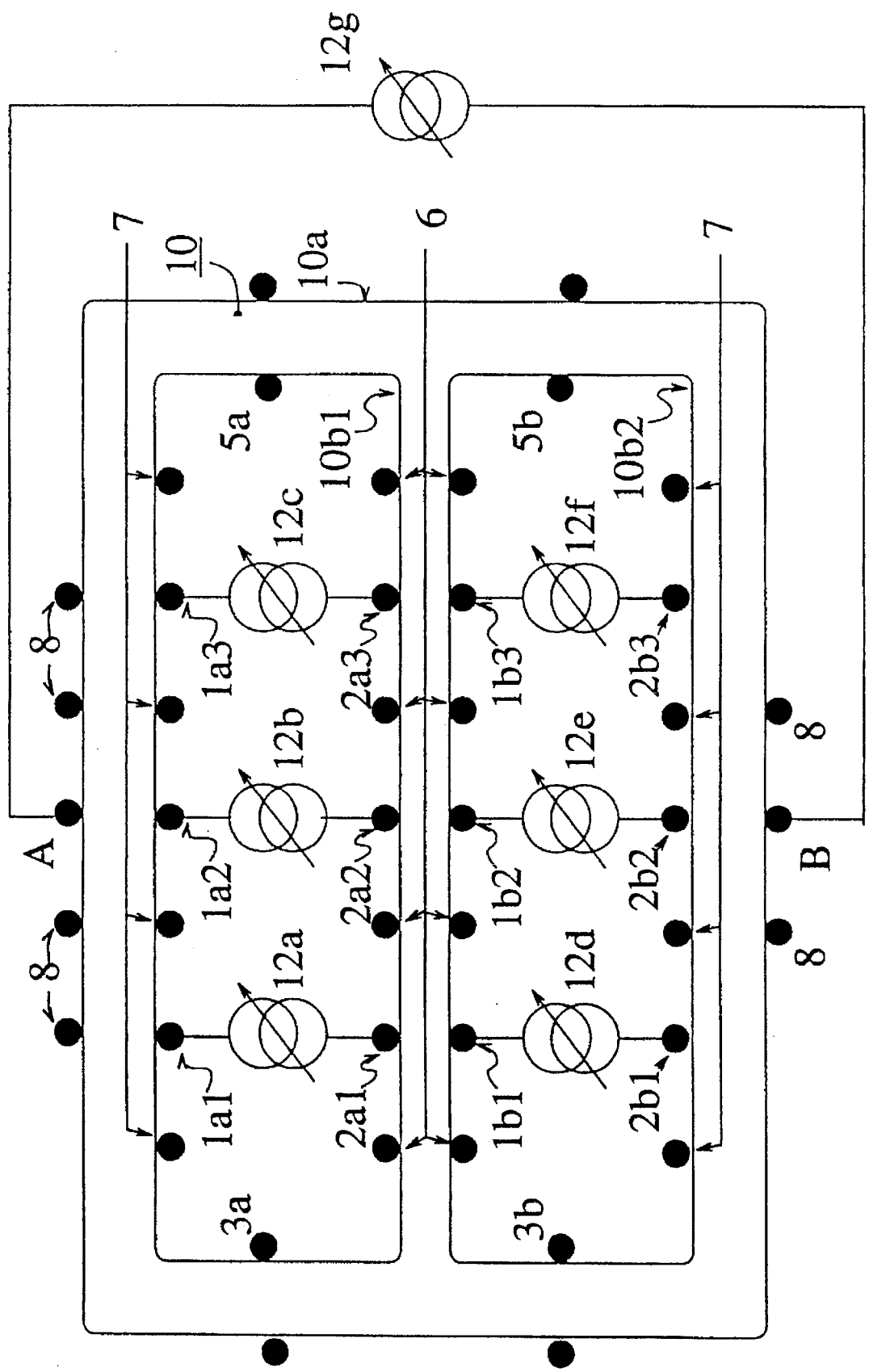

The Hall-effect device as shown in FIG. 12 has a Hall element 10 with two holes bounded by on inner edge 10b1 and 10b2 respectively. At the inner edge 10b1 of the one hole three pairs 1a1-2a1, 1a2-2a2 and 1a3-2a3 of current contacts are provided spaced away from each other. Each pair is coupled to a current source 12, 12b and 12c respectively. Correspondingly three pairs 1b1-2b1, 1b2-2b2 and 1b3-2b3 of current connections are provided at the inner edge 10b2 of the second hole which are coupled to the current sources 12d, 12e and 12f respectively. At the center of the narrow sides of the inner edges of the two holes Hall voltage connections 3s, 5a and 3b,5b are provided. In addition, between the current connections and to the side thereof on the long sides of the inner edges Hall voltage connections 6 and 7 are provided. At the outer edge 10 opposite the connections 3a, 3b, 5a and 5b a Hall voltage connection is provided in each case. The outer edge 10a also has additional Hall voltage connections 8 opposite to some of the inner edge connections 7. Between two current connections A,B at the outer edge 10a a current source 12a is connected.

In this device too, the Hall voltage is generated differentially and integrated in situ the same as in FIG. 12. For instance, the signal between the Hall voltage connections 3a, 5a integrates the Hall voltage which is generated by three current sources connected to the inner edge 10b. This example shows also that it is not necessary to connect the current source or current sources between connections of two different edges of the Hall element.

The number of current connection pairs and current sources which are connected to the inner edge 10b2 of the second hole may be different to the number of current connection pairs and current sources connected to the inner edge 10b1 of the first hole.

Figure 13:
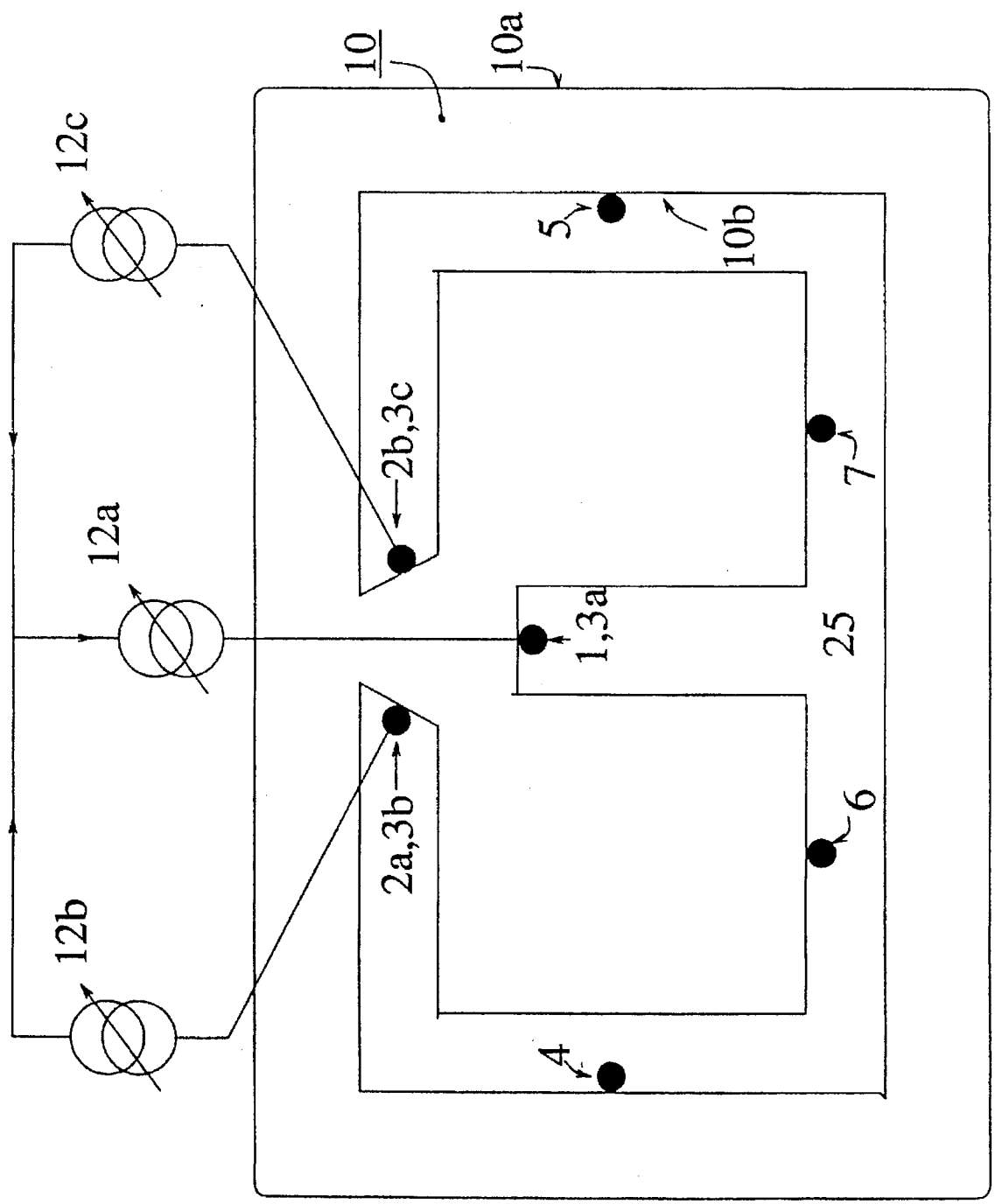

FIG. 12 shows a first example of a three-terminal Hall-effect device with one Hall element having at least one hole. The Hall element 10 as shown in FIG. 13 has a hole 25 bounded by an inner edge 10b. This hole has roughly the shape of an upside-down "M", the outer legs of which have slanted ends projecting towards the center leg. At the ends of the projections and of the middle leg one each of the three current connections 1, 2a, 2b is provided. These current connections are each coupled to a terminal of a corresponding current source 12a, 12b and 12c respectively, the other terminals of which are interconnected. At the inner edge 10b any number of Hall voltage connections 3a, 3b, 3c, 4-7 may also be provided, each of the Hall voltage connections 3a, 3b and 3c coinciding with a current connection 1, 2a and 2b respectively.

The device as shown in FIG. 13 may be operated as follows; by means of the current source 12a a current of prescribed strength is injected into the Hall element and received by the current sources 12b, 12c from the Hall element. Splitting the current to the current sources 12b and 12c is set so that the offset voltage between two Hall voltage connections disappears. One particularly advantageous feature of this configuration is that a Hall voltage may also be obtained between two current connections, e.g. 2a, 2b which simultaneously constitute Hall voltage connections 3b, 3c. It is to be noted that practically no current flows in the region of the Hall voltage connections 4-7. The Hall voltage obtained e.g. between the Hall voltage connections 6 and 7 is thus free of any current-dependent offset voltage.

Figure 14:
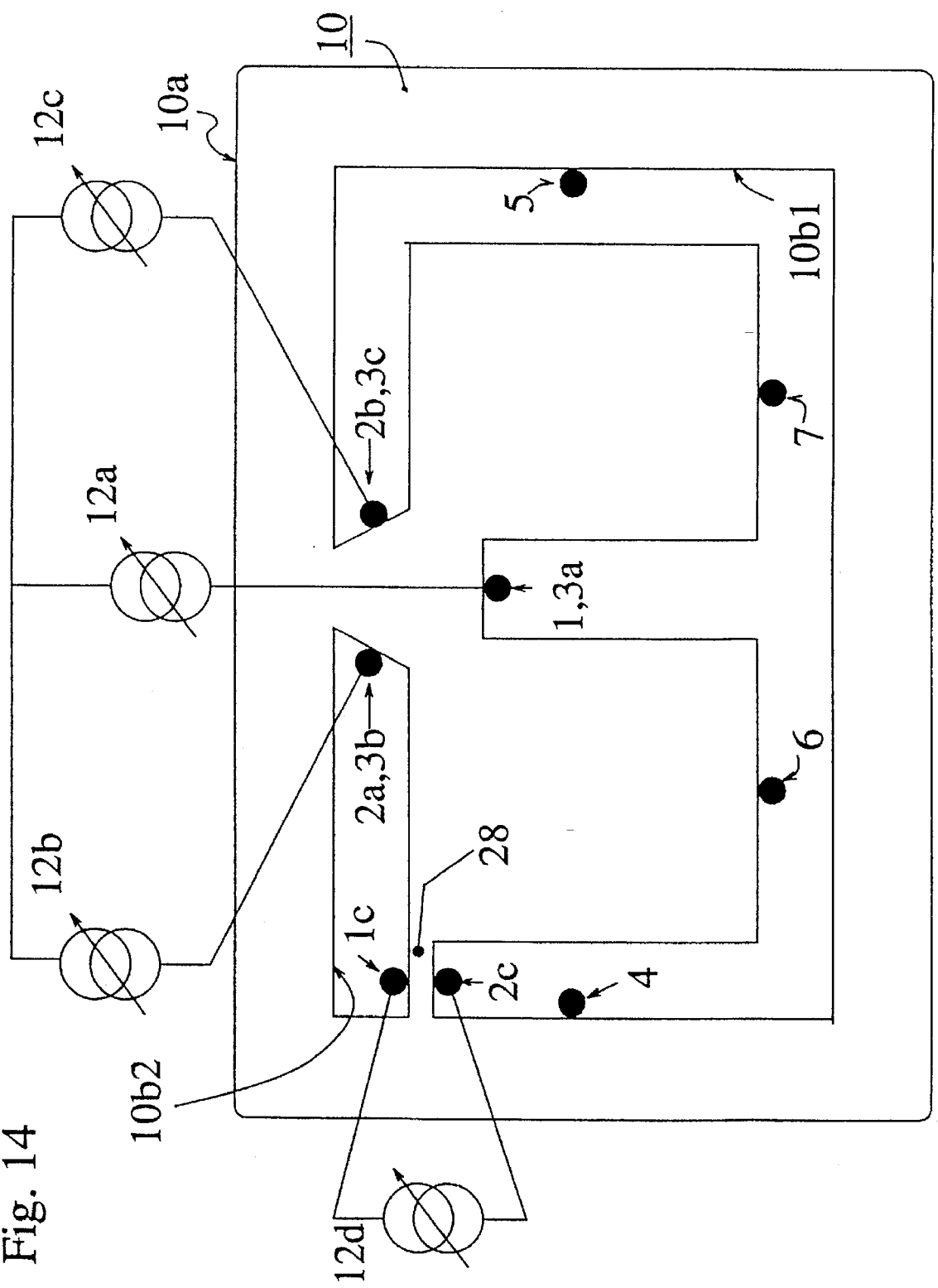

In a three-terminal Hall-effect device of the type as explained on the basis of FIG. 13 it is not necessary that all current connections are provided at one and the same edge, as the example illustrated in FIG. 14 shows. The Hall-effect device shown in FIG. 14 has a similar configuration to that shown in FIG. 13 except that the sole hole in FIG. 13 on the left-hand leg is divided by a web 28 into two holes. The connections 2a, 3b are now located on the inner edge 10b2 of the second hole. On opposite sides of the web 28 connections 1c, 2c may be provided which are coupled to a fourth current source 12d. The functioning of the device as shown in FIG. 14 is accordingly totally analogous to that shown in FIG. 13.

Figure 15:
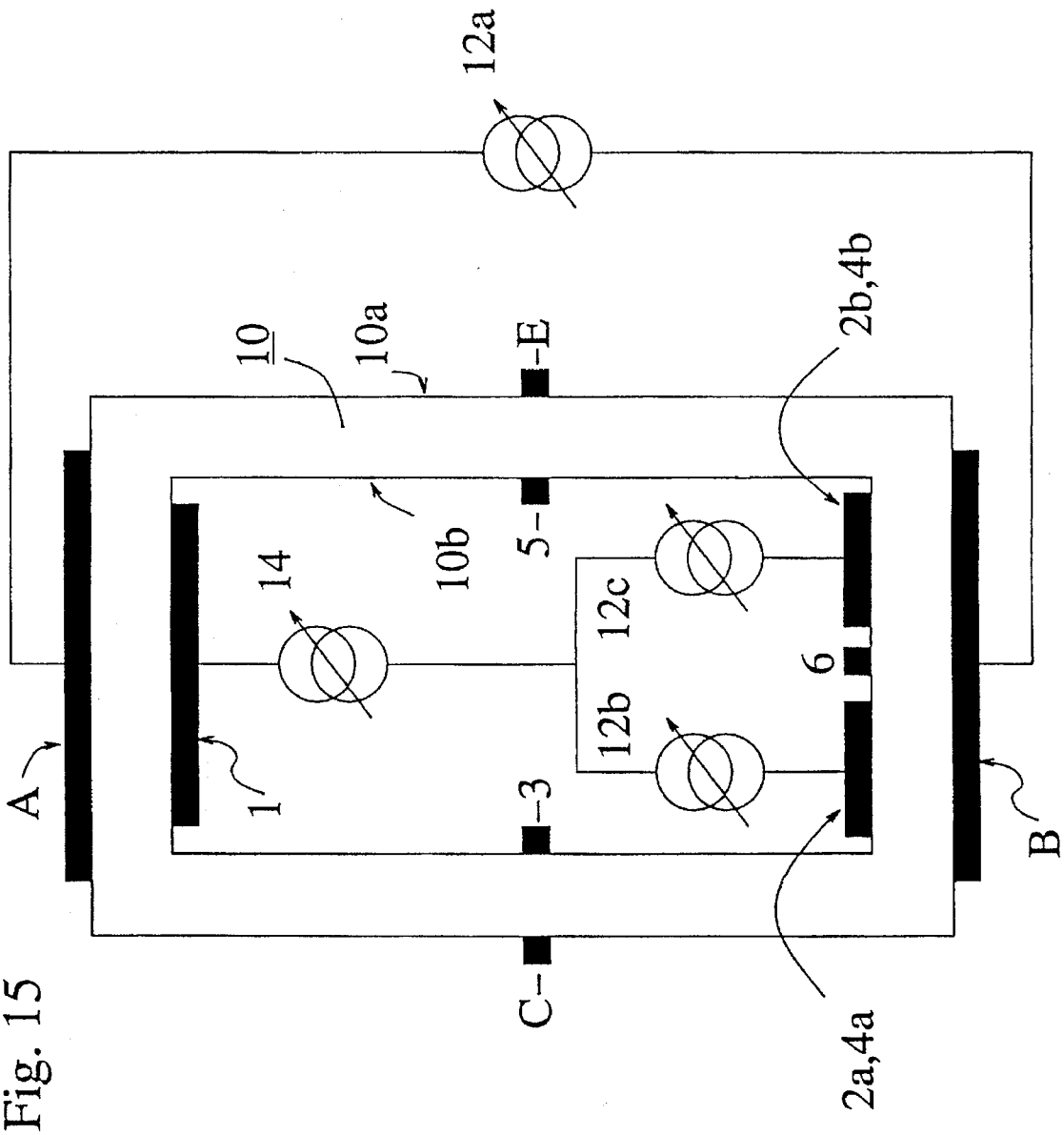

FIG. 15 shows a modified three-terminal Hall-effect device having additional connections at the outer edge of the Hall element 10 which has the shape of a rectangular frame or a topologically equivalent shape. Between two current connections A,B on the narrow sides of the outer edge 10a a first current source 12a is connected. An arrangement of three further current sources 14, 12b and 12c, corresponding to the current source arrangement 12a, 12b and 12c in FIG. 13 is connected between a current connection 1 located opposite current connection A on the inner edge 12b and current connections 2a, 2b located opposite the current connection B on the inner edge 10b. On the outer edge and inner edge Hall voltage connections C, E, 3, 4a, 4b, 5, 6 are additionally provided. It is to be noted that the Hall voltage connections 4a and 4b are formed by the current connections 2a and 2b respectively.

Here too, the current connections 12a-12c and 14 are adjusted so that the current disappears in the longitudinal legs of the device. One advantage of this configuration is that the remaining offset voltage can be compensated particularly well at the Hall voltage connections C, E and 3,5 by suitably adjusting the relative magnitudes of the drain currents of the current sources 12b and 12c.

In the example embodiment shown in FIG. 15 the connections A, B, 1, 2a and 4b take up a relatively large region of the corresponding edge.

Figure 16:
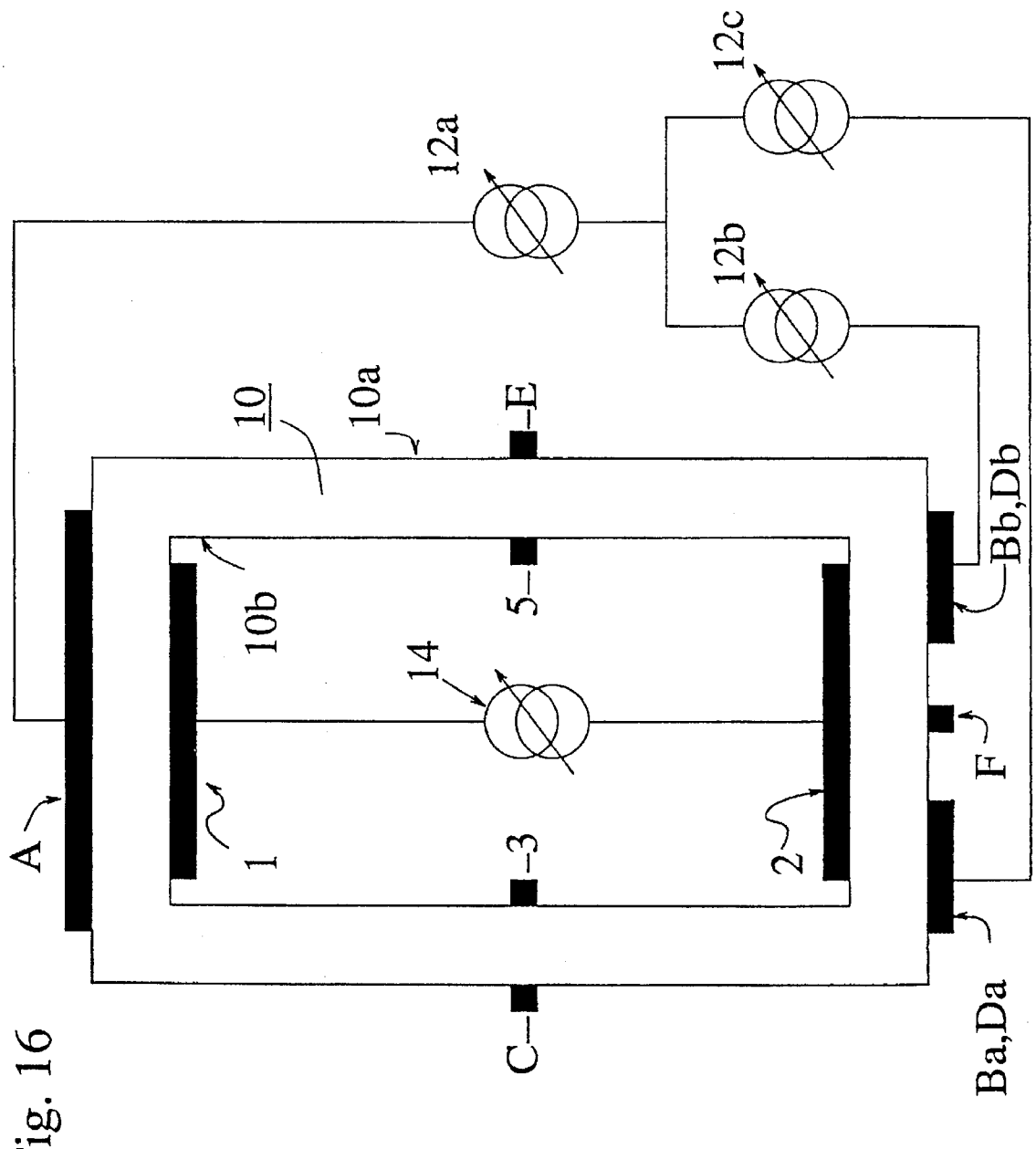

FIG. 16 shows a Hall-effect device which is so-to-speak an inverse arrangement of the Hall-effect device shown in FIG. 5, i.e. that one current source arrangement (split-drain configuration) comprising three current sources 12a, 12b and 12c is connected to the outer edge 10a. This arrangement as shown in FIG. 16 may be operated the same as that shown in FIG. 15.

Figure 17:
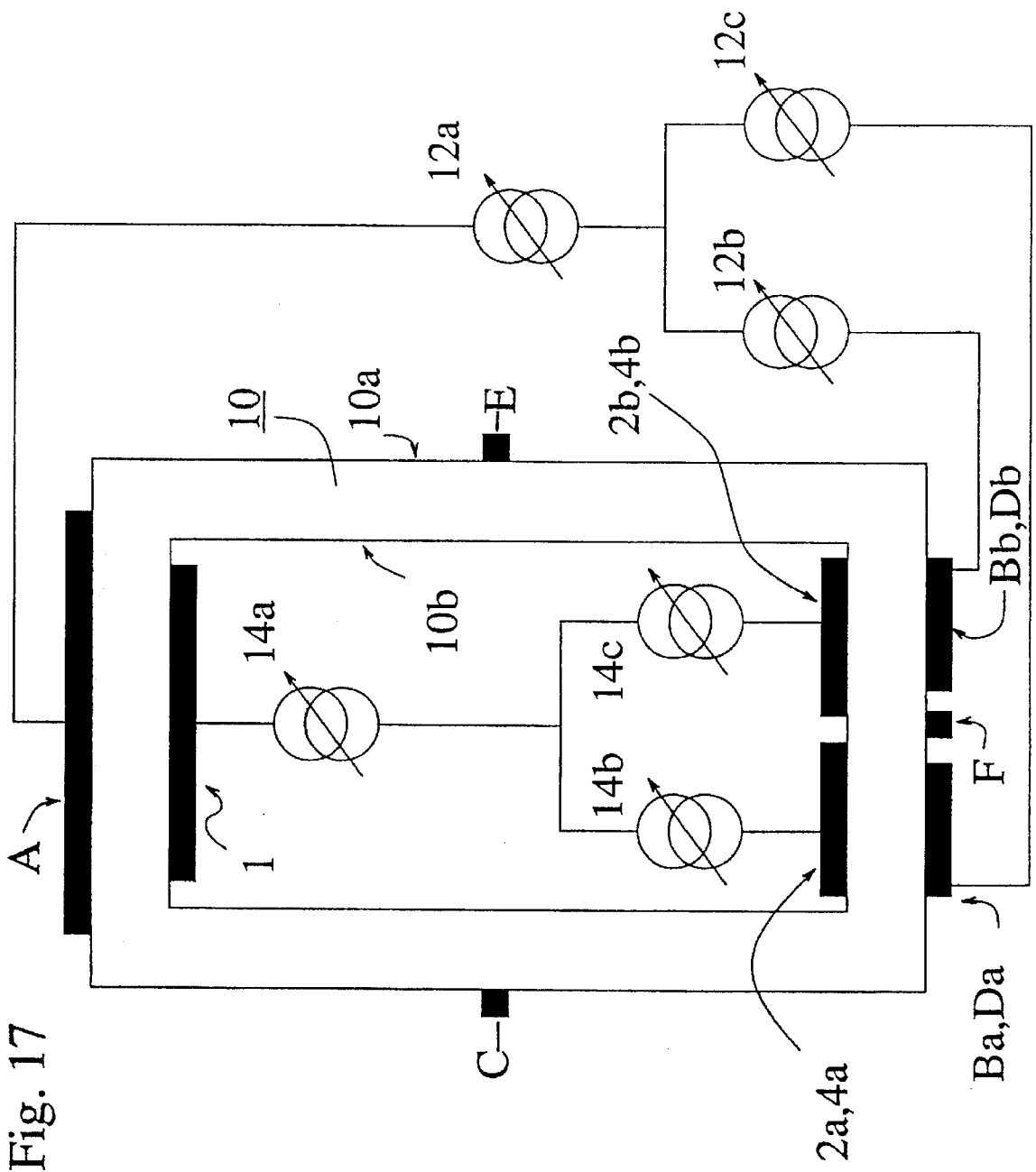

The Hall-effect device as shown in FIG. 17 is a combination of the devices as illustrated in FIGS. 16 and 16, i.e. a three terminal current source arrangement 12a, 12b, 12c and 12d, 12e, 12f respectively is coupled to both the outer edge 10a and the inner edge 10b. The current sources 12b and 12c are coupled to the connections Ba, Bb on the narrow side of the outer edge, these connections also permitting use as Hall voltage connections Da, Db.

As shown in FIG. 17 two drain current sources 12b, 12c and 14b, 14c respectively are coupled to the same short leg of the rectangular Hall element. The source current sources 12a, 14a are coupled to the other short leg, whereas FIG. 18 shows the drain current sources coupled to opposing narrow legs.

Figure 18:
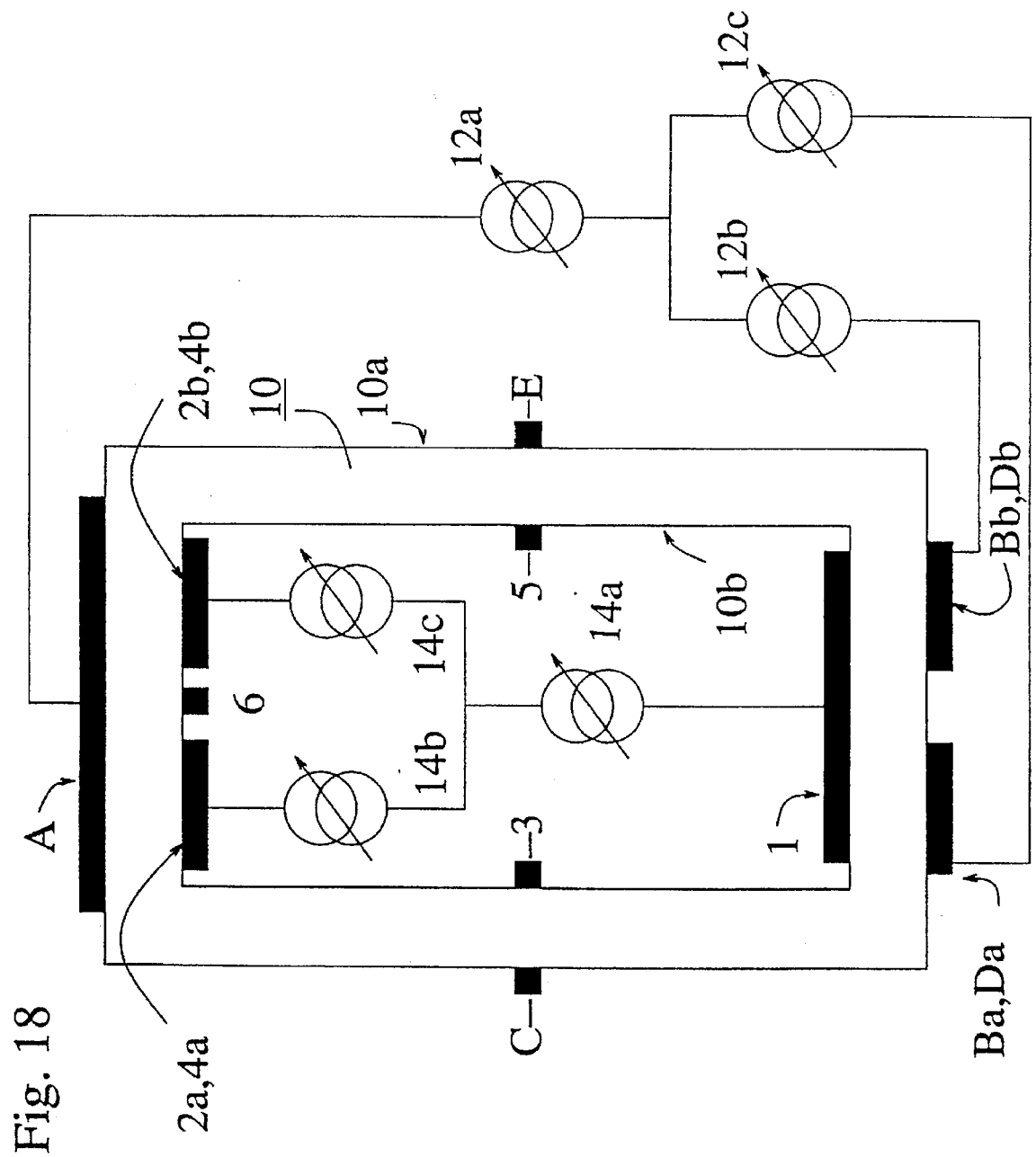
Figure 19:
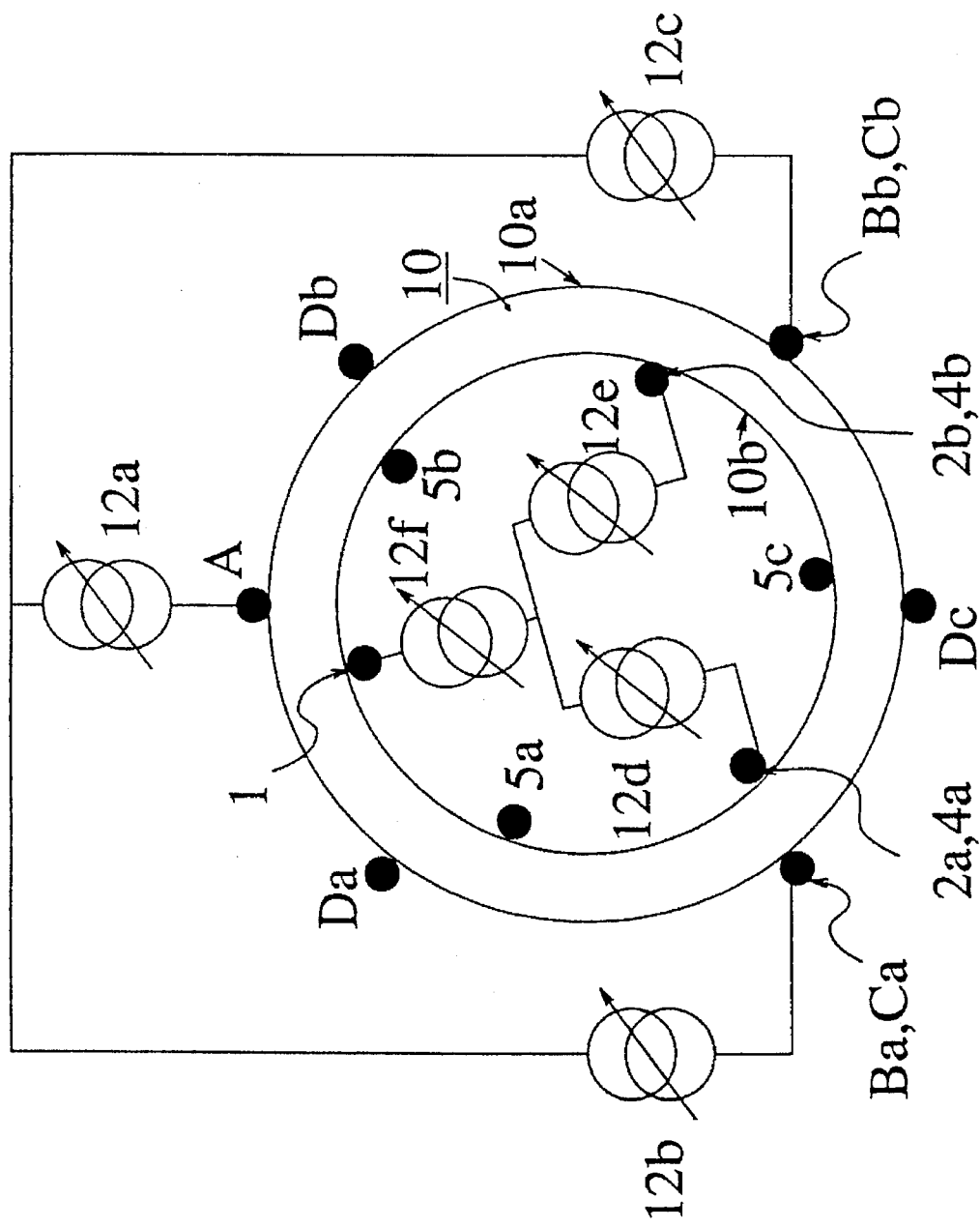

FIG. 19 shows a device having a similar configuration to that as shown in FIG. 18. Here, however, the Hall element 10 is ring-shaped, the current sources 12a, 12b and 12c being coupled to connections A, Ba, Bb on the outer edge of the Hall element displaced by 120° with respect to each other, whilst the current sources 12e, 12f and 12d are coupled to three connections 1, 2a, 2b of the inner edge 10b which may have angular displacements of 120° from each other and may be displaced by an arbitrary angle with respect to the current connections on the outer edge. In all other respects this device corresponds to that shown in FIG. 18.

Figure 20:
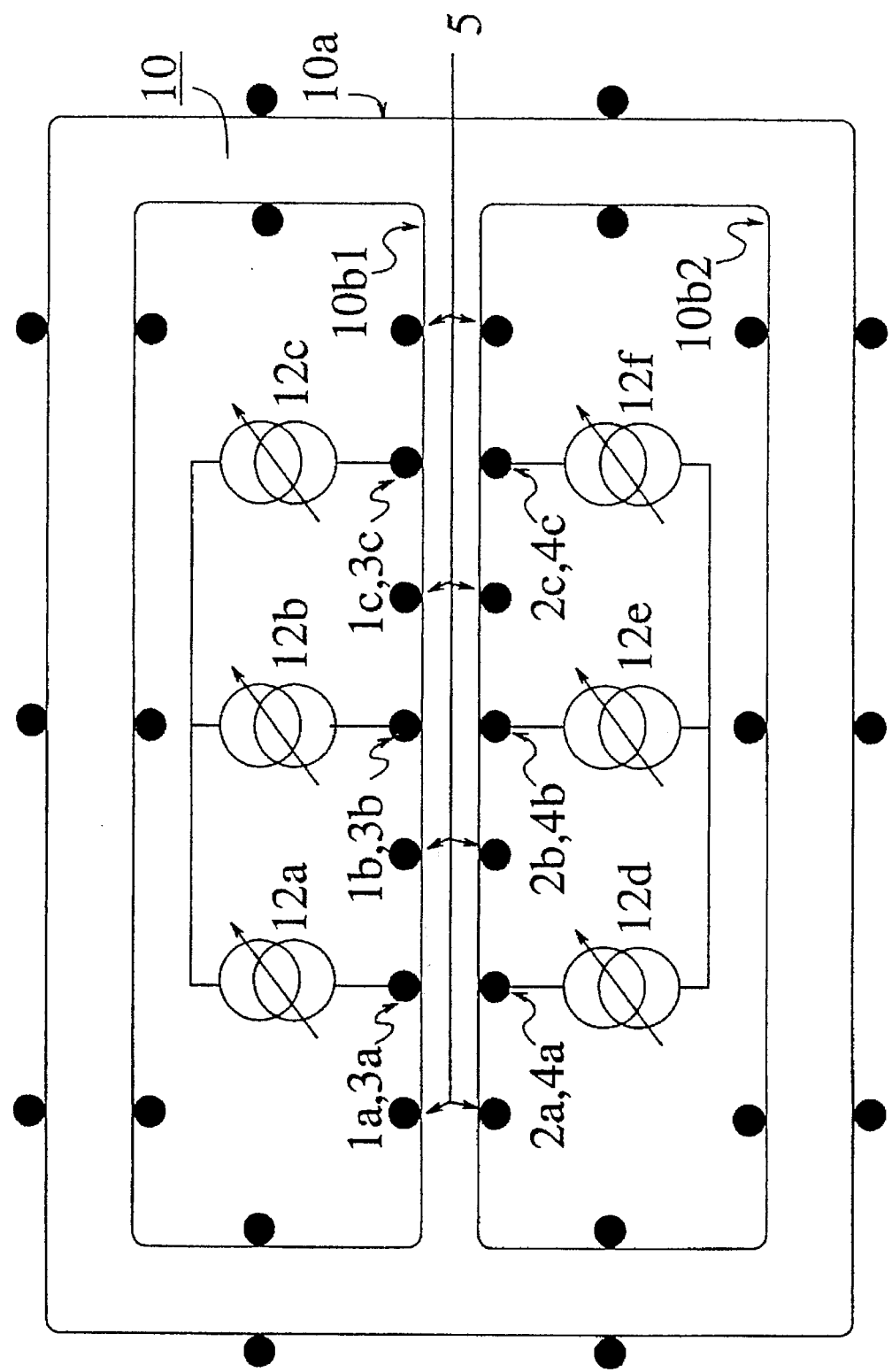

FIG. 20 shows a Hall-effect device whose Hall element 10 has two holes bounded by an inner edge 10b1 and 10b2 respectively. To each inner edge a three-terminal current source arrangement 12a, 12b,12c and 12d,12e,12f respectively of the aforementioned type is connected. A Hall voltage may be obtained, among other things, from the connection pairs identified by 5. The three-terminal current sources are coupled to connections provided on the web separating the two holes, i.e. opposing each other. The device as shown in FIG. 20 operates analogously to that already described for FIGS. 17 19.

Figure 21:
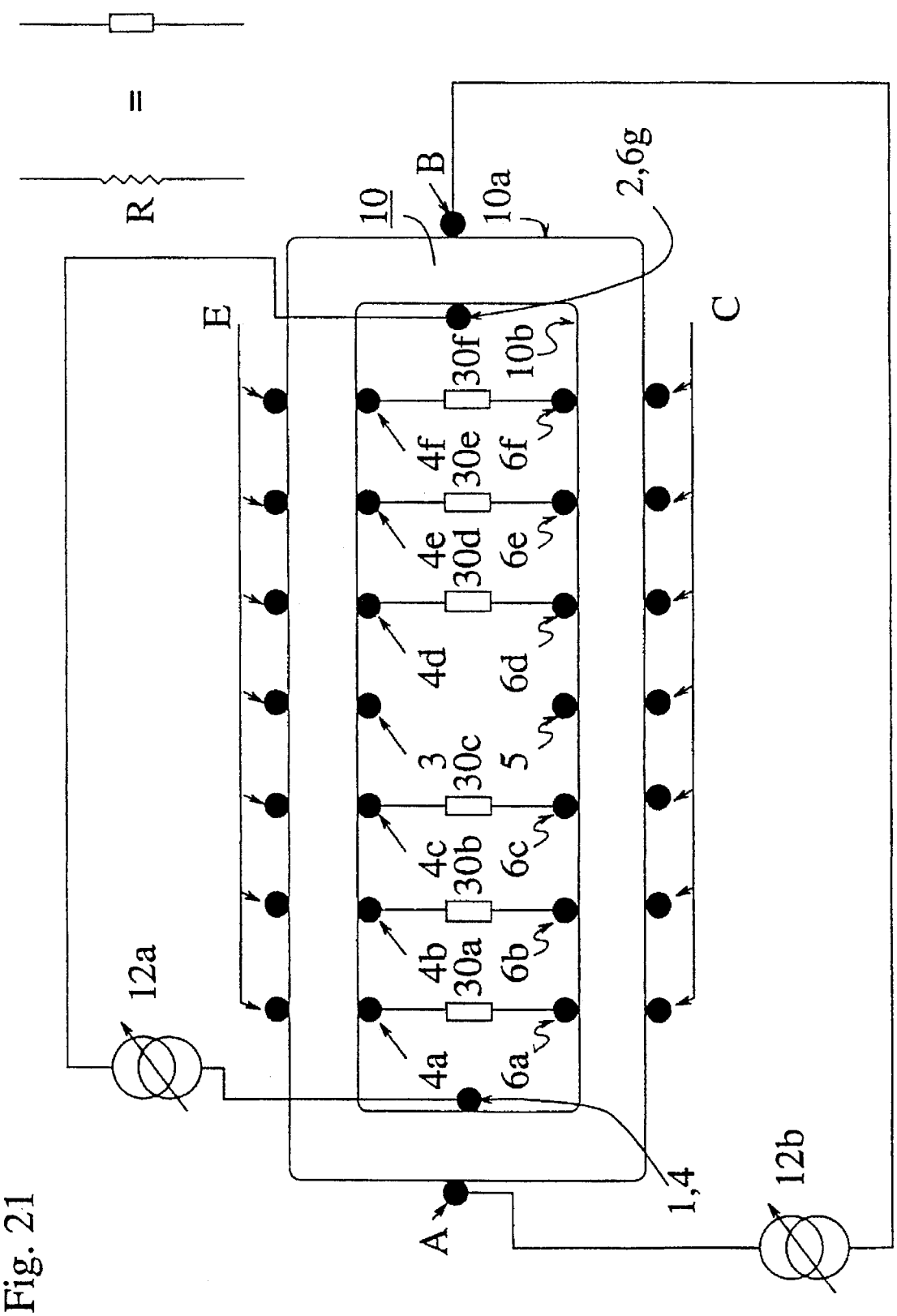

FIG. 21 shows a Hall-effect device with a rectangular Hall element 10 having a hole with an inner edge 10b. A first current source 12a is coupled to connections 1,2 at locations on the short sides of the inner edge opposite to each other. A second current source 12b is coupled to connections A,B at locations on the narrow sides of the outer edge 10a opposite to each other. At locations 4a-6a, 4b-6b, . . . 4f-6f of the inner edge 10b Hall voltage connections are provided opposite to each other, each Hall voltage connection being coupled to the other by a resistor 30a, 30b, . . . and 30f respectively These resistors may have equal or differing values. The currents of the current sources 12a, 12b are adjusted so that the current disappears in the region of the connections 3, 5 and C,E. One advantage to be had from this embodiment is that between successive connections, such as 4a, 4f, a Hall voltage may be obtained which as regards a field inversion is symmetrical and is substantially free of offset voltage misalignments.

Figure 22:
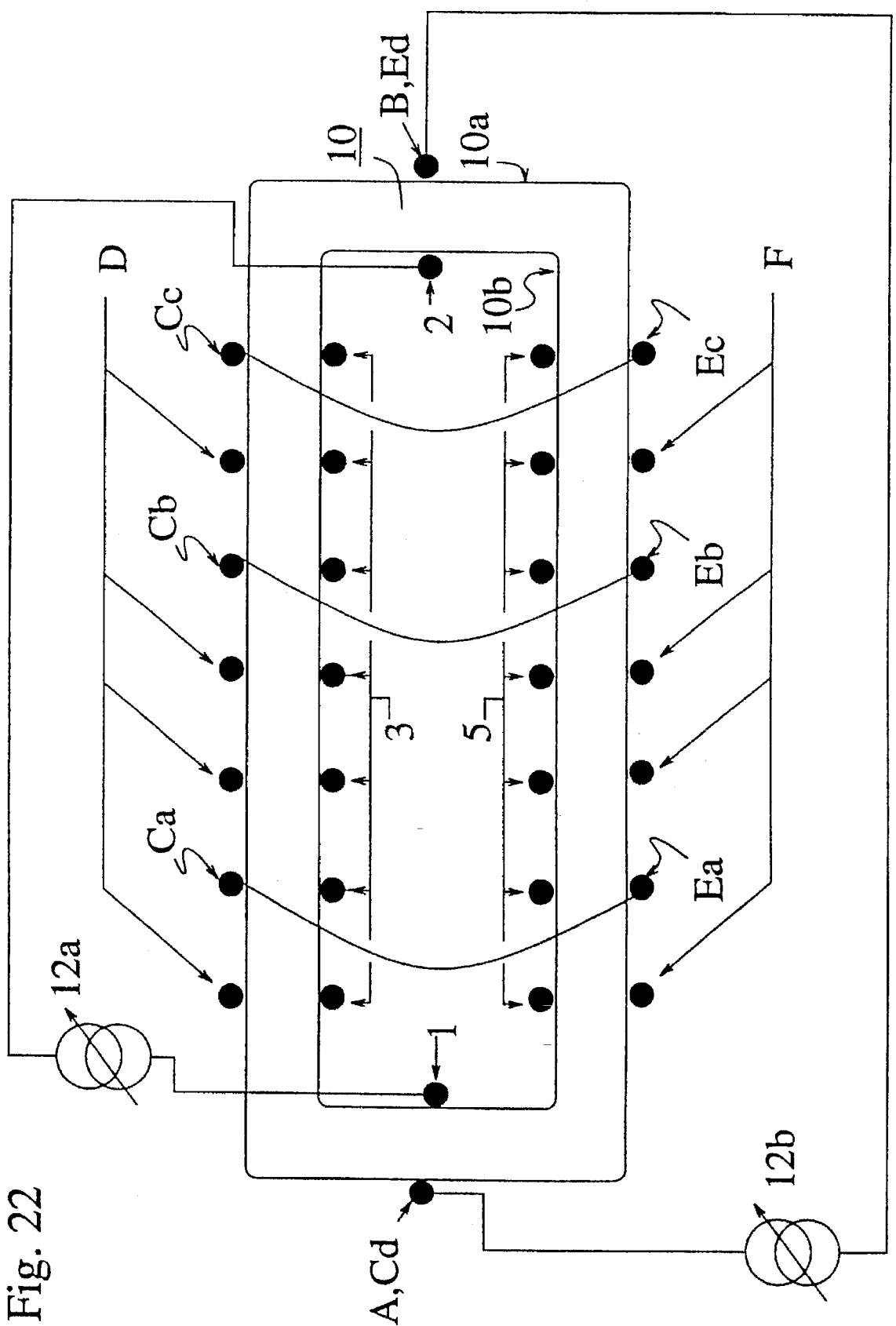

The device as shown in FIG. 22 contains a frame-shaped Hall element 10 having a hole bounded by an outer edge 10a and by an inner edge 10b. At opposite locations on the long sides of the outer edge Hall voltage contacts Ca, Cb, Cc, D, Ea, Eb, Ec and F are provided. At opposite locations on the inner edge Hall voltage contacts 3 and 5 respectively are provided. At least one pair (in the example embodiment shown three pairs Ca-Ea, Cb-Eb, Cc-Ec) of Hall voltage contacts of the outer edge are DC coupled, e.g. via a resistor (not shown) as in FIG. 21 or, as shown, by a short-circuit link. This device operates the same as that shown in FIG. 21.

Figure 23:
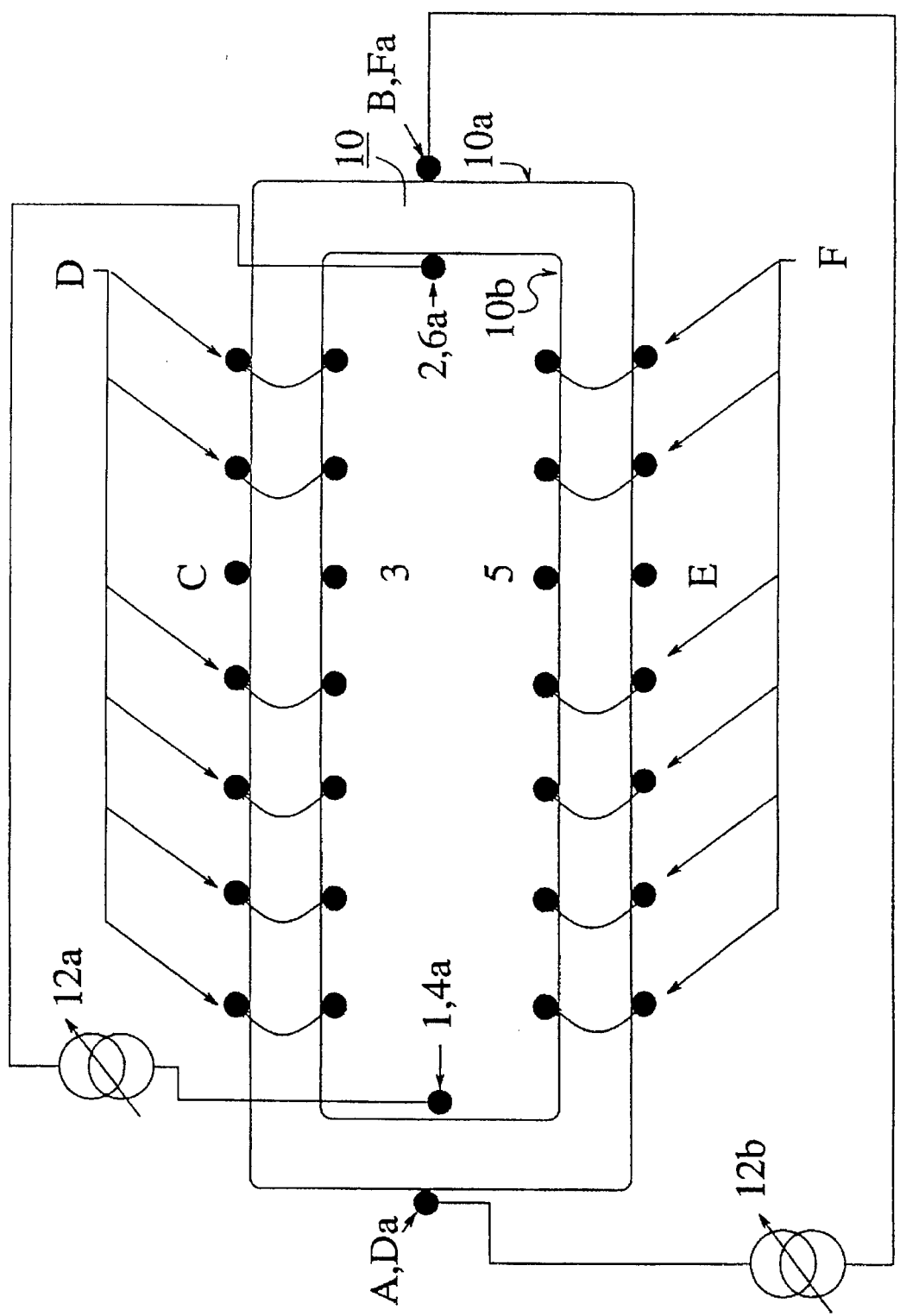

FIG. 23 shows a Hall-effect device having a similar configuration to that shown in FIG. 22, except that here one or more pairs of Hall voltage contacts located opposite to each other on the outer edge and inner edge of the same leg are interconnected DC coupled, e.g. by a separate resistor in each case or by a short-circuit link. This device may be employed to compare currents injected at the outer edge or inner edge.

Figure 24:
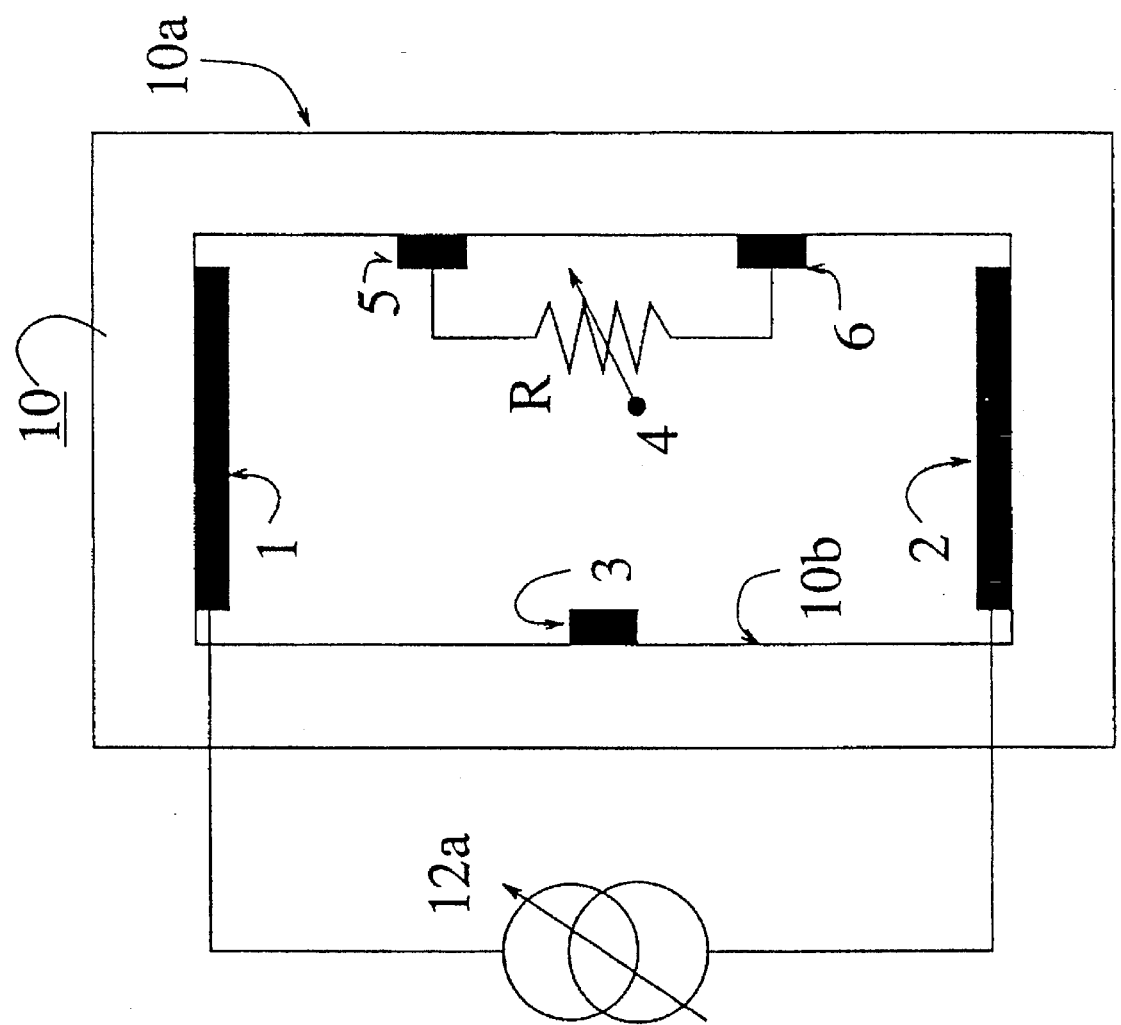

FIG. 24 illustrates a Hall-effect device with a Hall element 10 having a hole bounded by an inner edge 10b. In this case the outer edge 10a is of no importance. At opposed, expanded locations of the narrow sides of the inner edge current connections 1,2 are provided which are connected to a current source 12a. At the center of the one long side of the inner edge a first Hall voltage connection 3 is provided. On the opposite long side two connections 5,6 are provided substantially symmetrical to the center. The connections 5,6 are connected to the ends of the resistor of a potentiometer R. A magnetic field-dependent Hall voltage is obtained between connection 3 and the wiper 4 of the potentiometer. The wiper is set so that the current-dependent offset voltage disappears. Splitting a Hall voltage connection into two connections 5,6 and obtaining the Hall voltage via a potentiometer may also find application in the other embodiments.

All of the embodiments discussed may, of course, be modified diversely, e.g. by combining the various features of various example embodiments. As the semiconductor material for the Hall element materials other than those as mentioned above may, of course, be used, e.g. $A_N B_Y$ semiconductor compounds.

To enhance the sensitivity the Hall element may be coated with a soft-magnetic material and/or contain a superconductive material.

What is claimed is:

1. A Hall effect device with at least one Hall element exhibiting a Hall voltage when subjected to a magnetic field having at least one component oriented vertically to the Hall element, said Hall element having a planar or platelike shape and being provided with current connections and Hall voltage connections, and at least one hole bounded by an inner edge in the plane perpendicular to the vertical magnetic field component with one of said connections arranged at said inner edge.

2. A Hall-effect device as set forth in claim 1, characterized in that at said inner edge (10b) at least one current connection (1 and/or 2) and at least one pair of Hall voltage connections (3,4; 5,6) are arranged.

3. A Hall-effect device (FIG. 1a) as set forth in claim 1, characterized by a substantially C-shaped hole having an inner edge (10b) bounding a web-like region (10s) of said Hall element (10), two current connections (1,2) of said web-like region (10s) and at least two Hall voltage connections (3,14; 5,6) at said inner edge.

4. A Hall-effect device (FIG. 2) as set forth in claim 1, characterized in that said Hall element (10) is additionally bounded by an outer edge (10a), a first pair of current connections (A, B) is arranged at two opposed locations of said outer edge, a second pair of current connections (1, 2) is arranged at two opposed locations of said inner edge, at least a first pair of Hall voltage connections (3,5) is arranged at two opposed locations of said inner edge between the current connections (1,2) of said second pair.

5. A Hall-effect device as set forth in claim 4, characterized by at least a second pair of Hall voltage connections (C,E) at two opposed locations of said outer edge (10a) between the current connections (A,B) of said first pair.

6. A Hall-effect device as set forth in claim 4, characterized in that a first current source (14;16,R1) is coupled to the current connections (A,B) of said first pair and that a second current source (12;16,R2) is coupled to the current connections (1,2) of said second pair, the polarities and magnitudes of the currents furnished by said current sources being dimensioned that misalignment voltages resulting due to a drop in voltage at said Hall element are reduced at said Hall voltage connections.

7. A Hall-effect device (FIG. 2) as set forth in claim 6, characterized in that the current sources (12, 14) are poled so that the current flows from a current connection, A at said outer edge (10a) to a neighboring current connection 1 at said inner edge (10b) and from a current connection (B) at said outer edge (10a) to a neighboring current connection (2) at said inner edge (10b).

8. A Hall-effect device (FIG. 6) as set forth in claim 6, characterized in that the current sources (16, R1, R2) are poled so that the current flows from neighboring current connections (1,A) of said first and second pair to the other neighboring current connections (B,2).

9. A Hall-effect device (FIG. 10b, FIG. 10c) as set forth in claim 1, characterized by at least two holes, separated by a web-like region (20, 20a; 20b) of said Hall element, two current connections (1a, 2a; 1b, 2b) at opposite sides of said web-like region, and a current source (12c, 12d) coupled to said current connections.

10. A Hall-effect device as set forth in claim 9, characterized by a further current source (12a) arranged with current connections (A,B) at an outer edge of said Hall element.

11. A Hall-effect device as set forth in claim 9, characterized by a current source (12b) coupled to a first and to a second current connection (1,2) at the inner edge (10b2, 10b1) of a first and of a second hole.

12. A Hall-effect device (FIG. 11) as set forth in claim 2, characterized in that said Hall element (10) has the shape of a frame bounded by an outer edge (10a) and by an inner edge (10b);

a pair of current connections (A1, 1a; B1, 2a; A2, 1b; B2, 2b) is provided at each of several locations symmetrical with respect to said frame-shaped Hall elements at opposing locations of said outer and said inner edge and at least one pair of Hall voltage connections (C, 3; D, 4; E, 5; F, 6) is provided spaced away from said current connections on said outer and inner edge.

13. A Hall-effect device (FIG. 12) as set forth in claim 1, characterized in that said Hall element has at least one first hole bounded by a first inner edge (10b1) and at least one second hole bounded by a second inner edge (10b2);

a pair of current connections (1a1, 2a1) is arranged at at least one pair of opposed locations on said first inner edge;

a current source (12a, . . .) is connected between each pair of said current connections;

a pair of second current connections (1b1, 2b1) is arranged at at least two opposed locations on said second inner edge (10b2);

each pair of said second current connections is coupled to a current source (12d, . . .) and at least one pair of Hall voltage connections (6,7) is provided at each inner edge.

14. A Hall-effect device as set forth in claim 13, characterized in that a further current source (12a) having two current connections (A,B) is coupled to an outer edge (10a) of said Hall element.

15. A Hall-effect device (FIG. 13) as set forth in claim 1, characterized in that at least one hole is bounded by an E-shaped boundary (25) each end of which a current contact (1, 2a, 2b) is arranged;

said three current contacts are coupled to a current source arrangement (12a, 12b, 12c) having a source connection and two drain connections; and at the inner edge of said hole at least one pair of Hall voltage connections is provided.

16. A Hall-effect device as set forth in claim 15, characterized in that at least one leg of said hole is divided by a web (28).

17. A Hall-effect device as set forth in claim 16, characterized in that at said web is short-circuited by a current source (12d).

18. A Hall-effect device (FIG. 15) as set forth in claim 1, characterized in that a three-terminal current source arrangement (12b, 12c, 12d) having three current connections (1, 2a, 2b) is coupled to the inner edge (10b) of at least one hole.

19. A Hall-effect device (FIG. 16, FIG. 17, FIG. 18) as set forth in claim 1, characterized in that a three-terminal current source arrangement is coupled via three current connections (A, Ba, Bb) to an outer edge (10a) of said Hall element.

20. A Hall-effect device (FIG. 21, FIG. 22, FIG. 23) as set forth in claim 1, characterized in that at least one pair of Hall voltage connections is short-circuited by a direct current conducting link.

21. A Hall-effect device (FIG. 24) as set forth in claim 1, characterized in that at least one Hall voltage connection of a pair is formed by a top (4) of a potentiometer (R), the ends of which are connected to two connections (5, 6) provided on one edge of said Hall element.

22. A Hall-effect device as set forth in claim 1, characterized in that said Hall element has an outer and an inner edge substantially spaced equidistance from each other.

* * * * *